(12) United States Patent
Ho et al.

(10) Patent No.: US 10,522,468 B2
(45) Date of Patent: Dec. 31, 2019

(54) INTERCONNECT STRUCTURE AND METHOD

(71) Applicant: Taiwan Semiconductor Manufacturing Company, Ltd., Hsinchu (TW)

(72) Inventors: Chun-Te Ho, Taipei (TW); Ming-Chung Liang, Hsinchu (TW); Chien-Chih Chiu, Xinying (TW); Chien-Han Chen, Nantou County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/664,109

(22) Filed: Jul. 31, 2017

(65) Prior Publication Data

US 2019/0035734 A1    Jan. 31, 2019

(51) Int. Cl.
*H01L 23/532* (2006.01)
*H01L 21/768* (2006.01)
(Continued)

(52) U.S. Cl.
CPC .... *H01L 23/5329* (2013.01); *H01L 21/76804* (2013.01); *H01L 21/76814* (2013.01);
(Continued)

(58) Field of Classification Search
CPC ........... H01L 23/5329; H01L 23/53295; H01L 23/5226; H01L 23/528; H01L 23/5283;
(Continued)

(56) References Cited

U.S. PATENT DOCUMENTS

| 6,300,683 B1 * | 10/2001 | Nagasaka | ......... H01L 21/76804 257/303 |
| 6,774,032 B1 * | 8/2004 | Park | .................. H01L 21/76804 257/E21.577 |

(Continued)

FOREIGN PATENT DOCUMENTS

| DE | 102008045036 A1 | 7/2010 |
| DE | 102010064289 A1 | 6/2012 |

(Continued)

*Primary Examiner* — Lex H Malsawma
*Assistant Examiner* — Gardner W. S. Swan
(74) *Attorney, Agent, or Firm* — Slater Matsil, LLP

(57) ABSTRACT

An embodiment includes a method. The method includes: forming a first conductive line over a substrate; depositing a first dielectric layer over the first conductive line; depositing a second dielectric layer over the first dielectric layer, the second dielectric layer including a different dielectric material than the first dielectric layer; patterning a via opening in the first dielectric layer and the second dielectric layer, where the first dielectric layer is patterned using first etching process parameters, and the second dielectric layer is patterned using the first etching process parameters; patterning a trench opening in the second dielectric layer; depositing a diffusion barrier layer over a bottom and along sidewalls of the via opening, and over a bottom and along sidewalls of the trench opening; and filling the via opening and the trench opening with a conductive material.

20 Claims, 27 Drawing Sheets

(51) Int. Cl.
*H01L 23/522* (2006.01)
*H01L 23/528* (2006.01)

(52) U.S. Cl.
CPC .. *H01L 21/76843* (2013.01); *H01L 21/76883* (2013.01); *H01L 23/528* (2013.01); *H01L 23/5226* (2013.01)

(58) Field of Classification Search
CPC ....... H01L 21/76804; H01L 21/76807–76816; H01L 21/76829; H01L 21/76835; H01L 21/76843; H01L 21/76877; H01L 21/76879; H01L 21/76883
See application file for complete search history.

(56) References Cited

U.S. PATENT DOCUMENTS

| | | | |
|---|---|---|---|
| 8,563,426 B2 | 10/2013 | Chumakov et al. | |
| 9,837,306 B2 | 12/2017 | Wu et al. | |
| 9,893,028 B2 | 2/2018 | Yu et al. | |
| 2002/0055202 A1* | 5/2002 | Yang | H01L 21/31053 438/118 |
| 2002/0068442 A1* | 6/2002 | Shimpuku | H01L 21/76811 438/638 |
| 2002/0175414 A1 | 11/2002 | Teh et al. | |
| 2003/0162353 A1* | 8/2003 | Park | H01L 27/10855 438/253 |
| 2004/0238964 A1* | 12/2004 | Kawano | H01L 21/76804 257/758 |
| 2005/0142850 A1* | 6/2005 | Cho | H01L 21/76807 438/624 |
| 2007/0126121 A1 | 6/2007 | Shue et al. | |
| 2010/0055902 A1 | 3/2010 | Frohberg et al. | |
| 2010/0200999 A1* | 8/2010 | Yamazaki | H01L 23/5222 257/774 |
| 2010/0323514 A1 | 12/2010 | Isobayashi et al. | |
| 2012/0112314 A1* | 5/2012 | Jou | H01L 23/5223 257/532 |
| 2012/0161327 A1* | 6/2012 | Chumakov | H01L 21/76804 257/773 |
| 2013/0178068 A1 | 7/2013 | Yen et al. | |
| 2014/0117560 A1* | 5/2014 | Lee | H01L 23/5283 257/774 |
| 2015/0262864 A1 | 9/2015 | Okamoto et al. | |

FOREIGN PATENT DOCUMENTS

| | | |
|---|---|---|
| JP | 2011003883 A | 1/2011 |
| JP | 6056868 B2 | 1/2017 |
| TW | 428268 B | 4/2001 |
| TW | 201724192 A | 7/2017 |
| TW | 201724436 A | 7/2017 |

* cited by examiner

INTERCONNECT STRUCTURE AND METHOD

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its dielectric constant (k-value), and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
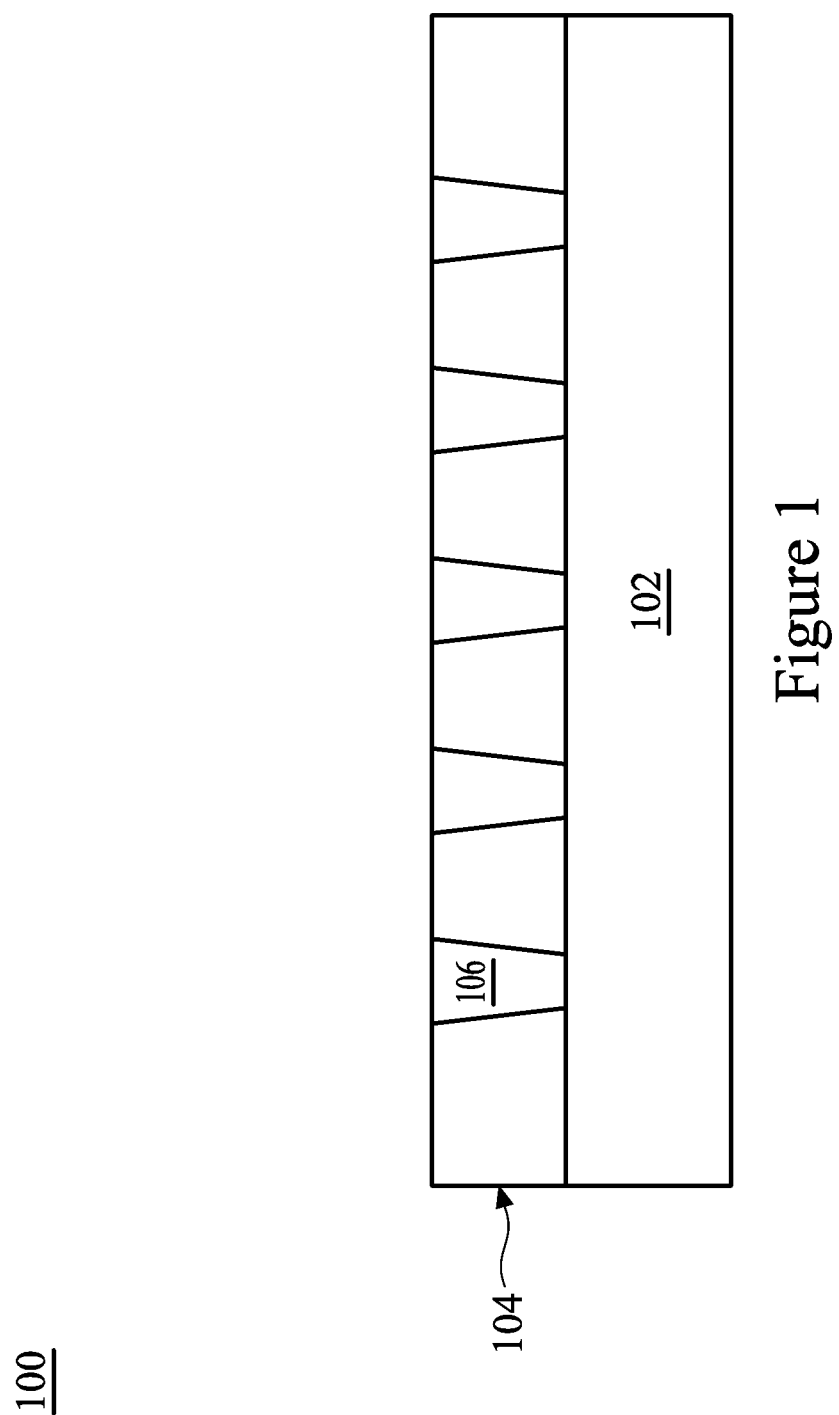
FIGS. 1, 2, 3, 4, 5, 6, 7, 8, 9, 10, 11, 12, 13, and 14 illustrate cross-sectional views of intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and method are provided, according to some embodiments. In particular, an interconnect structure is formed having an intermediate layer between an inter-metal dielectric (IMD) and an etch stop layer underlying the IMD. The intermediate layer has a different k-value than the IMD, and a different etch rate than the IMD relative a same etching process. As a result of the different etch rates, a via that is formed has more vertical sidewalls in the intermediate layer than it does in the IMD. The overall vertical profile of the via is improved, thereby increasing the distance between the via and adjacent conductive lines. By increasing the distance between the via and adjacent conductive lines, leakage currents in the interconnect structure may be reduced, and breakdown voltages of the interconnect structure may be increased.

FIGS. 1 through 14 illustrate cross-sectional views of intermediate stages in the formation of interconnect structures of integrated circuits, in accordance with some embodiments. FIGS. 1 through 14 may illustrate formation of the interconnect structures using a dual damascene process. FIGS. 1 through 14 illustrate embodiments where a via opening is formed before a trench opening, which may be referred to as a "via first" process. Although FIGS. 1 through 14 illustrate the formation of a single via and conductive trench, it should be appreciated that many vias and conductive trenches may be simultaneously formed in the steps shown.

FIG. 1 illustrates wafer 100, which includes a substrate 102 and features formed over the substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the wafer 100 is used to form a device die. In such embodiments, integrated circuit devices are formed on the top surface of the substrate 102. Exemplary integrated circuit devices may include complementary metal-oxide semiconductor (CMOS) transistors, resistors, capacitors, diodes, or the like. The details of the integrated circuit devices are not illustrated herein. In some embodiments, the wafer 100 is used for forming interposers. In such embodiments, no active devices such as transistors or diodes are formed on the substrate 102. There may (or may not) be passive devices such as capacitors, resistors, inductors, or the like formed in the wafer 100. The substrate 102 may also be a dielectric substrate in the embodiments in which the wafer 100 is an interposer. Furthermore, through vias (not shown) may be formed to penetrate through the substrate 102 in order to interconnect components on the opposite sides of the substrate 102.

In FIG. 1, an inter-layer dielectric (ILD) 104 is formed over the substrate 102. In embodiments where integrated circuit devices are formed on the substrate 102, the ILD 104 fills the space between the gate stacks of transistors (not shown) of the integrated circuit devices. The ILD 104 may be formed from phosphosilicate glass (PSG), borosilicate glass (BSG), boron-doped phosphosilicate glass (BPSG), fluorine-doped silicate glass (FSG), tetraethyl orthosilicate (TEOS), or the like. The ILD 104 may be a layer formed from a low-k dielectric material having a k-value lower than about 3.0. In some embodiments, the ILD 104 is formed using spin coating or the like. In some embodiments, the ILD 104 is formed using a deposition method such as plasma enhanced chemical vapor deposition (PECVD), flowable chemical vapor deposition (FCVD), low pressure chemical vapor deposition (LPCVD), or the like.

Further in FIG. 1, contact plugs 106 are formed in the ILD 104. The contact plugs 106 are electrically connected to the integrated circuit devices of the substrate 102. For example, the contact plugs 106 may be gate contact plugs that are connected to the gate electrodes of transistors (not shown) of the integrated circuit devices, and/or may be source/drain contact plugs that are electrically connected to the source/drain regions of the transistors. Openings for the contact plugs 106 are formed through the ILD 104. The openings may be formed using acceptable photolithography and etching techniques. A liner, such as a diffusion barrier layer, an adhesion layer, or the like may be formed in the openings, and a conductive material may be formed in the openings over the liner. The liner may include titanium, titanium nitride, tantalum, tantalum nitride, or the like. The conductive material may be cobalt, copper, a copper alloy, silver, gold, tungsten, copper, aluminum, nickel, or the like. A planarization process, such as a grinding, chemical-mechanical polish (CMP), or the like may be performed to remove excess material from a surface of ILD 104. The remaining liner and conductive material forms the contact plugs 106 in the openings.

Figure 2:
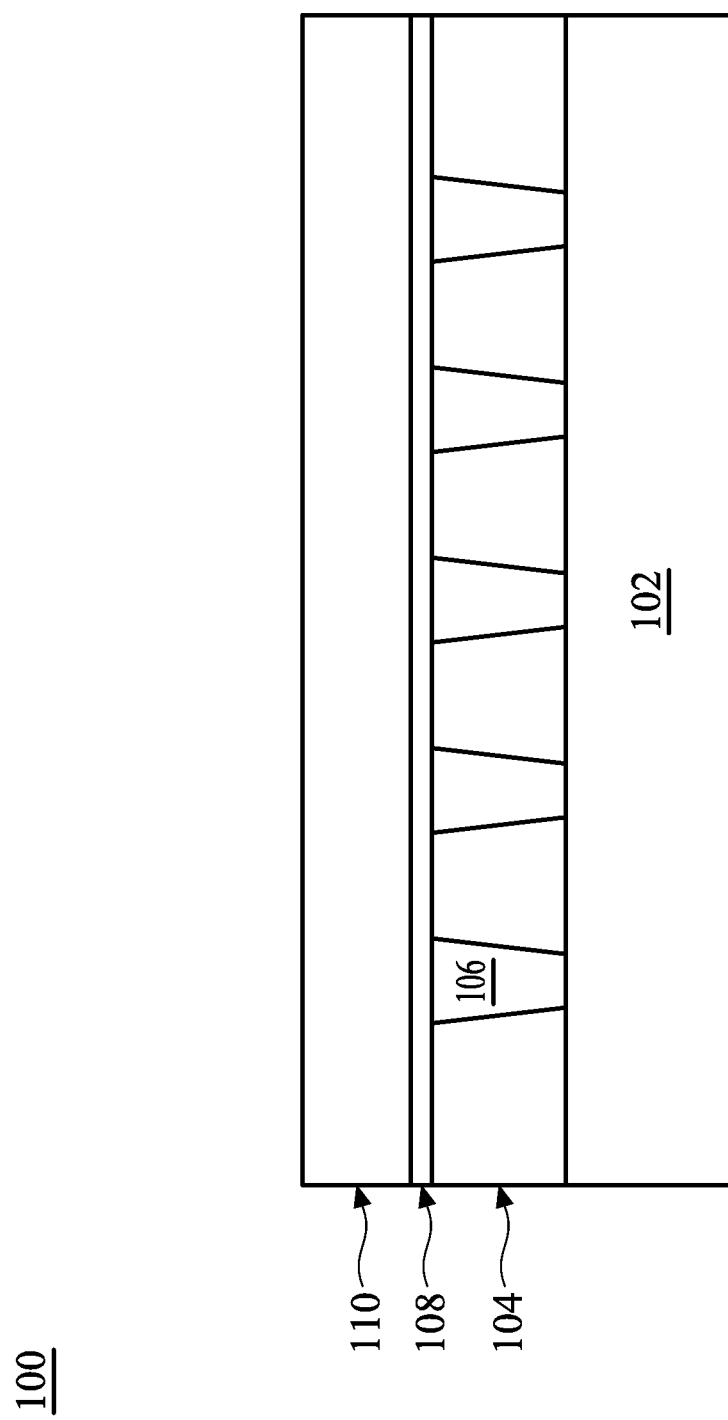

In FIG. 2, an etch stop layer 108 is formed over the integrated circuit devices of the substrate 102 (if any), ILD 104, and contact plugs 106. The etch stop layer 108 may be formed from silicon carbide, silicon nitride, silicon oxynitride, silicon carbo-nitride, or the like. The etch stop layer 108 may be formed by chemical vapor deposition (CVD), physical vapor deposition (PVD), atomic layer deposition (ALD), a spin-on-dielectric process, the like, or a combination thereof.

Further in FIG. 2, an IMD 110 is formed over the etch stop layer 108. The IMD 110 may be a layer formed from a low-k dielectric material having a k-value lower than about 3.0. The IMD 110 may be a layer formed from an extra-low-k (ELK) dielectric material having a k-value of less than 2.5. In some embodiments, the IMD 110 may be formed from Black Diamond (a registered trademark of Applied Materials), an oxygen-containing and/or carbon containing low-k dielectric material, Hydrogen SilsesQuioxane (HSQ), MethylSilsesQuioxane (MSQ), or the like. The material of the etch stop layer 108 has a high etching selectivity with the IMD 110, and hence the etch stop layer 108 may be used to stop the etching of the IMD 110 in subsequent processing steps.

In some embodiments, the IMD 110 is formed from a porous material such as SiOCN, SiCN, SiOC, SiOCH, or the like and may be formed by initially forming a precursor layer over the etch stop layer 108. The precursor layer may include both a matrix material and a porogen interspersed within the matrix material, or may alternatively include the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 108, may also be utilized.

The matrix material, or base dielectric material, may be formed using a process such as PECVD, although any suitable process, such as a CVD, PVD, or even spin-on coating, may alternatively be utilized. The PECVD process may utilize precursors such as methyldiethoxysilane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, or the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the IMD 110. The porogen may be a material that is big enough to form the pores while also remaining small enough such that the size of the individual pores does not overly displace the matrix material. As such, the porogen may include an organic molecule such as alpha-terpinene (ATRP) (1-Isopropyl-4-Methyl-1,3-Cyclohexadiene) or cyclooctane (boat shape) or 1,2-bis(triethoxysilyl) ethane silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the IMD 110. For example, an anneal of in a range from about 200° C. and about 500° C., such as about 400° C., for in a range from about 10 seconds to about 600 seconds, such as about 200 seconds, may be utilized. Alternatively, other suitable processes may be used to remove the porogen, such as irradiating the porogen with ultraviolet (UV) radiation to decompose the porogen or utilizing microwaves to decompose the porogen.

Figure 3:
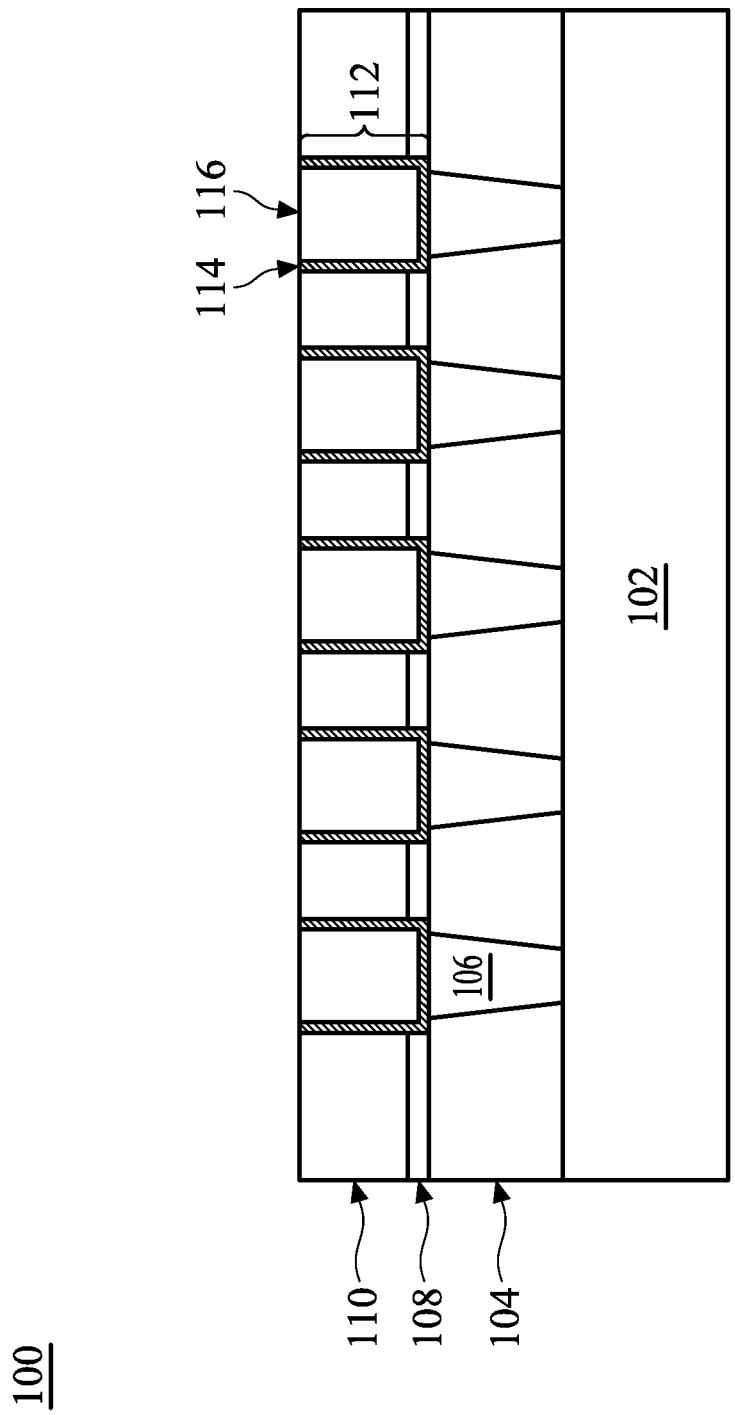

In FIG. 3, conductive lines 112 are formed in the IMD 110. In accordance with some embodiments, the conductive lines 112 include diffusion barrier layers 114 and conductive material 116 over the diffusion barrier layers 114. Openings are formed in the IMD 110 using, e.g., an etching process, where the etch stop layer 108 may be used to stop the etching process. Portions of the etch stop layer 108 in the openings may then be removed by a different etching process. The diffusion barrier layers 114 may be formed from TaN, Ta, TiN, Ti, CoW, or the like, and may be formed in the openings by a deposition process such as ALD or the like. The conductive material 116 may include copper, aluminum, tungsten, silver, and combinations thereof, or the like, and may be formed over the diffusion barrier layers 114 in the openings by an electro-chemical plating process, CVD, ALD, PVD, the like, or a combination thereof. In an embodiment, the conductive material 116 is copper, and the diffusion barrier layers 114 are thin barrier layers that prevent the copper from diffusing into the IMD 110. After formation of the diffusion barrier layers 114 and the conductive material 116, excess of the diffusion barrier layers 114 and conductive material 116 may be removed from the front side of the wafer 100 by, for example, a planarization process such as CMP.

In accordance with some embodiments of the present disclosure, metal caps (not shown) may be formed over the conductive lines 112. The metal caps may also be considered as parts of the conductive lines 112 throughout the description. In some embodiments, the metal caps are formed from cobalt (Co), CoWP, CoB, tungsten (W), tantalum (Ta), nickel (Ni), molybdenum (Mo), titanium (Ti), iron (Fe), or alloys thereof. The metal caps may be formed selectively using ElectroChemical Plating (ECP) or electroless plating, during which the wafer 100 is submerged in a plating solution. In alternative embodiments, the metal caps are blanket formed on the conductive lines 112 and IMD 110, followed by an etching process to remove undesirable portions.

Although the conductive lines 112 are shown as being formed in a bottom metal layer, which is the metal layer immediately over the contact plugs 106, it should be appreciated that the conductive lines 112 may also represent metal lines in any metal layer that is over the bottom metal layer. In such embodiments, there may be any number of layers, which may include dielectric layers, vias, lines, etc.

Figure 4:
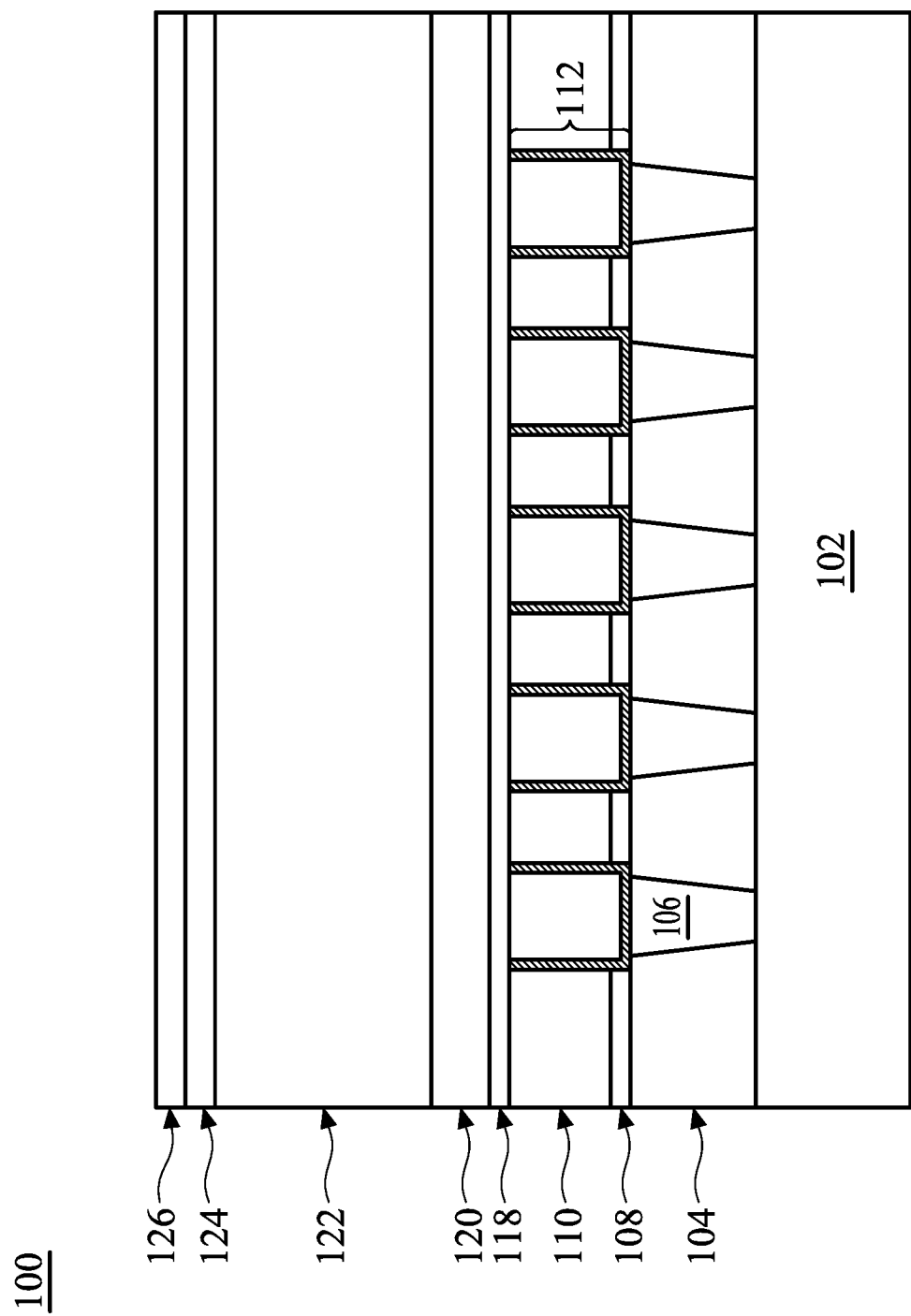

In FIG. 4, a film stack is formed over the IMD 110 and conductive lines 112. In accordance with some embodiments, the film stack is used to form metal vias and lines that are electrically connected to the conductive lines 112, contact plugs 106, and substrate 102. The film stack includes an etch stop layer 118, an intermediate layer 120, an IMD 122, a buffer layer 124, and a mask layer 126.

The etch stop layer 118 is in contact with the IMD 110 and conductive lines 112. The etch stop layer 118 may be formed of a material selected from the same candidate material of the etch stop layer 108, and may be formed using a method that is selected from the same group of candidate methods for forming the etch stop layer 108. The etch stop layer 108 and 118 may be formed from the same material, or may include different materials. The etch stop layer 118 may be formed to have a thickness of from about 10 Å to about 50 Å, such as about 30 Å.

The intermediate layer 120 is over the etch stop layer 118, and is formed from a dielectric material. In some embodiments, the intermediate layer 120 is formed from an oxide, such as silicon oxide, doped silicon oxide, or the like. In embodiments where the intermediate layer 120 is doped silicon oxide, it may be doped with C, H, N, the like, or a combination thereof. In such embodiments, the intermediate layer 120 may be doped to have a dopant concentration of from about $10^{16}$ cm$^{-3}$ to about $10^{18}$ cm$^{-3}$. The intermediate layer 120 may be formed by CVD, PVD, ALD, a spin-on-dielectric process, the like, or a combination thereof. In embodiments where the intermediate layer 120 is doped, it may be doped in-situ (e.g., without breaking a vacuum) during formation, or the intermediate layer 120 may be doped after formation. The intermediate layer 120 may be formed to have a thickness of from about 10 Å to about 300 Å. The intermediate layer 120 may be a different material than the etch stop layer 118. In an embodiment, the etch stop layer 118 is formed of silicon nitride or silicon oxynitride, and the intermediate layer 120 is formed of silicon oxide that is substantially free of nitride.

The IMD 122 is over the intermediate layer 120. The IMD 122 may be formed of a material selected from the same candidate material of the IMD 110, and may be formed using a method that is selected from the same group of candidate methods for forming the IMD 110. The IMD 110 and 122 may be formed from the same material, or may include different materials.

According to various embodiments, the etch stop layer 118, intermediate layer 120, and IMD 122 are each formed from different materials. In particular, the etch stop layer 118, intermediate layer 120, and IMD 122 each have a different relative permittivity. The k-value of the etch stop layer 118 is greater than the k-value of the intermediate layer 120, which is greater than the k-value of the IMD 122. In an embodiment, the etch stop layer 118 has a k-value of from about 9 to about 10; the intermediate layer 120 has a k-value of approximately half the etch stop layer 118, such as from about 3 to about 8, such as about 5; and the IMD 122 has a k-value of approximately half the intermediate layer 120, such as from about 2 to about 4.

Further, in a process for etching the IMD 122, the material of the etch stop layer 118 has a high etching selectivity with the intermediate layer 120 relative a same etch process, and the material of the IMD 122 has a high etching selectivity with the intermediate layer 120 relative a same etch process. In an embodiment, the etch rate of the IMD 122 is from about 2 to about 3 times greater than the etch rate of the intermediate layer 120 relative a same etch process. The difference in etch selectivity allows vias formed in the intermediate layer 120 to have a more vertical profile.

In some embodiments, the etch stop layer 118 may be the only etch stop layer underlying the IMD 122. In other words, no other intervening etch stop layers (besides the etch stop layer 118) may be formed between the IMD 122 and the conductive lines 112.

The buffer layer 124 is formed over the IMD 122, and the mask layer 126 is formed over the buffer layer 124. The buffer layer 124 may be formed from a dielectric, such as silicon oxide, and may be formed by CVD, PVD, ALD, a spin-on-dielectric process, or the like. The mask layer 126 may be formed from a material that includes a metal, such as titanium nitride, titanium, tantalum nitride, tantalum, or the like, and may be formed by PVD, Radio Frequency PVD (RFPVD), Atomic Layer Deposition (ALD), or the like. In subsequent processing steps, a pattern is formed on the mask layer 126. The mask layer 126 is then used as an etching mask, where the pattern of the mask layer 126 is used to etch the IMD 122. The buffer layer 124 provides stress reduction between the IMD 122 and the mask layer 126.

Figure 5:
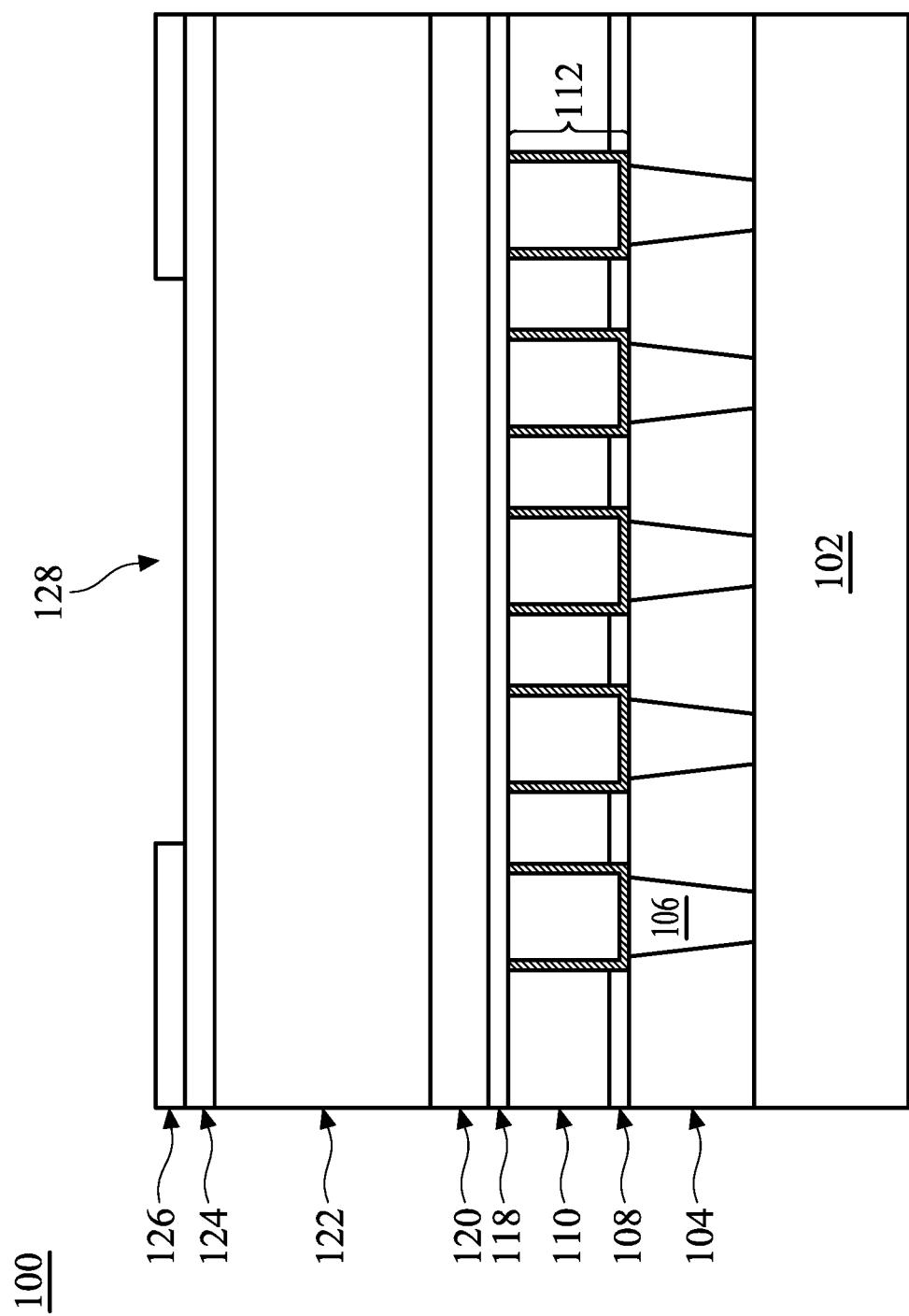

In FIG. 5, via openings 128 are formed in the mask layer 126. Formation of the via openings 128 may include performing a photolithography process to etch the mask layer 126 in order to form initial via openings. The photolithography process may include forming a photoresist over the mask layer 126, patterning the photoresist with openings corresponding to the via openings 128, extending the via openings 128 through the mask layer 126, and then removing the photoresist.

Figure 6:
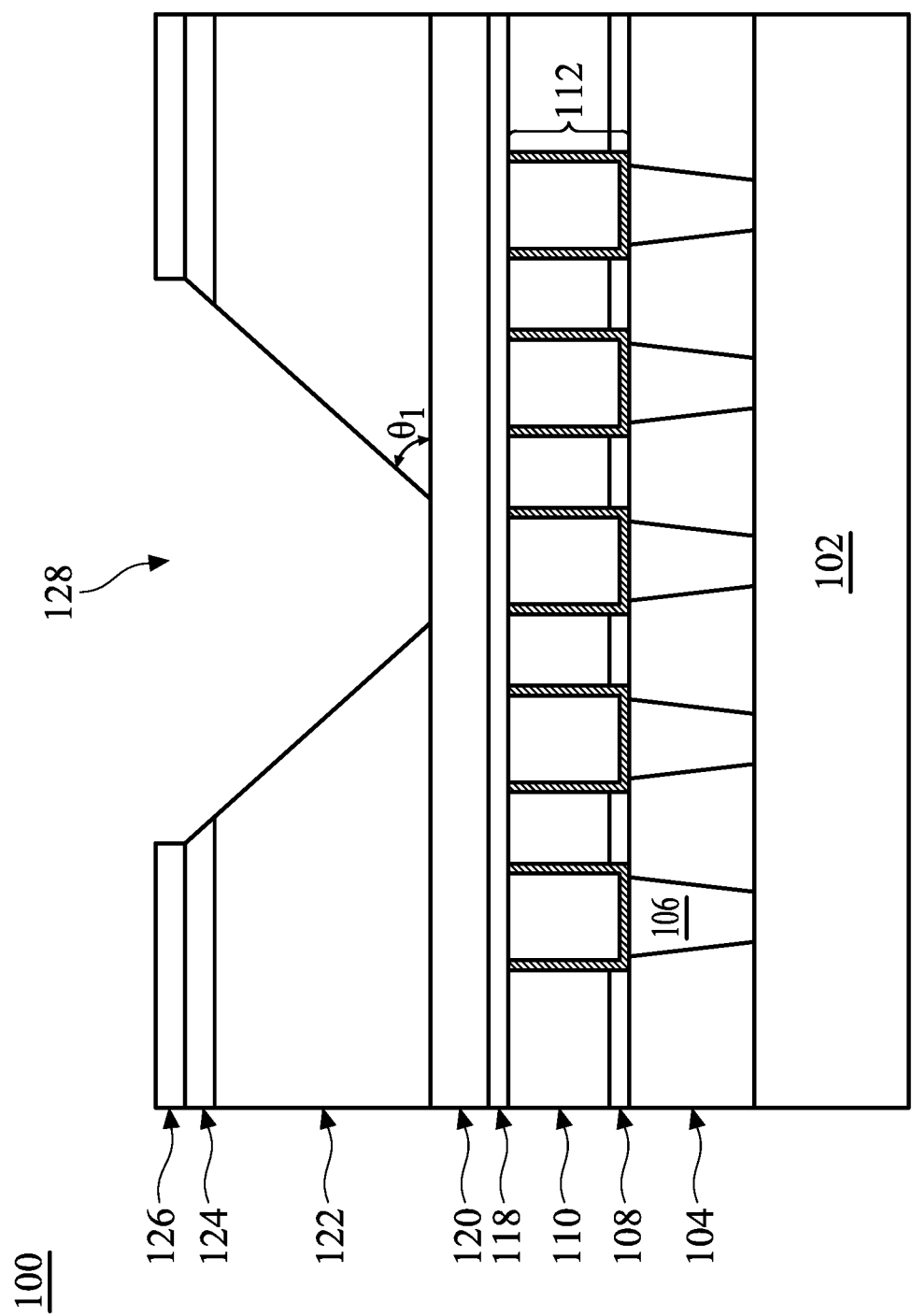

In FIG. 6, the via openings 128 are extended through the buffer layer 124 and IMD 122. The via openings 128 may be extended by using acceptable etching techniques. In an embodiment, the via openings 128 are formed by an anisotropic dry etch process. For example, the etching process may include a dry etch process using a reaction gas that selectively etches the IMD 122 without significantly etching the mask layer 126. For example, the etching process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In an embodiment, the etchant uses fluorocarbon chemistry with $O_2$ or Ar as the carrier gas. The sidewalls of the via openings 128 in the IMD 122 form angles $\theta_1$ with a plane parallel to the major surface of the substrate 102. The angle $\theta_1$ may be small. In an embodiment, the angle $\theta_1$ is from about 45° to about 50°.

Figure 7:
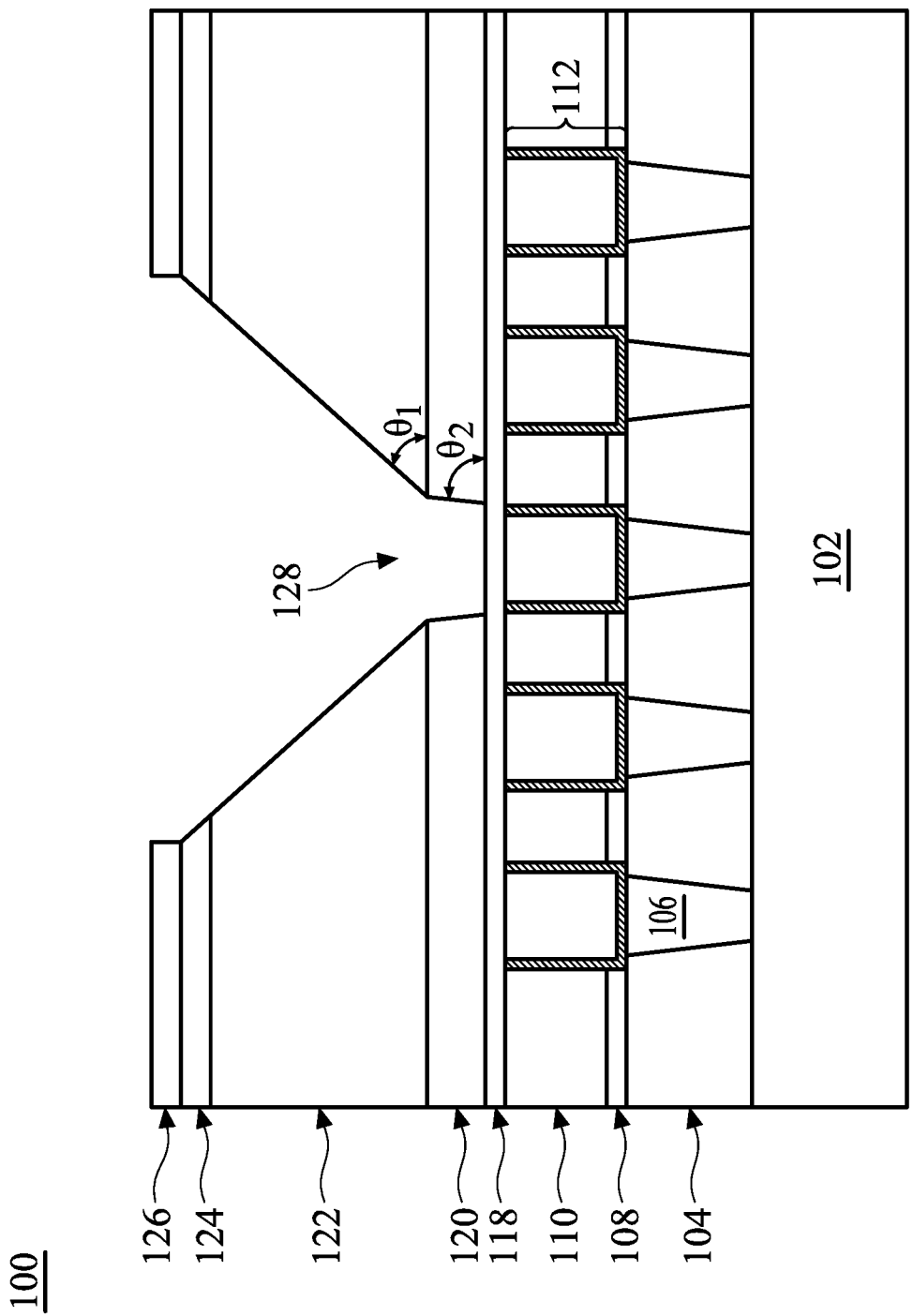

In FIG. 7, the via openings 128 are extended through the intermediate layer 120 using acceptable etching techniques. In accordance with various embodiments, the etching process used to extend the via openings 128 through the intermediate layer 120 uses the same etching process parameters (e.g., the same etchants) as the etching process used to etch the IMD 122. In an embodiment, the etching process used to etch the IMD 122 is continued to extend the via openings 128 through the intermediate layer 120. The etching process is performed until the via openings 128 expose the etch stop layer 118. Because of the etch selectivity between the intermediate layer 120 and the IMD 122, the etching process etches the intermediate layer 120 at a slower rate than the IMD 122.

The material of the IMD 122 (e.g., ELK dielectric material) may etch in a manner that produces sidewalls with a gradual slope. As a result of the slower etching rate of the intermediate layer 120, the material of the intermediate layer 120 may etch in a manner that produces sidewalls with a steeper slope than the IMD 122. The sidewalls of the via openings 128 in the intermediate layer 120 form angles $\theta_2$ with a plane parallel to the major surface of the substrate 102. The angle $\theta_2$ is greater than the angle $\theta_1$. In an embodiment, the angle $\theta_2$ is greater than about 70°, such as from about 70° to about 80°. As a result, the width of the via openings 128 decreases as they extend from the top surface of the IMD 122 towards the substrate 102, and the rate of change in width decreases as it extends towards the substrate 102.

The intermediate layer 120 may be formed to a sufficient thickness (e.g., from about 10 Å to about 300 Å) such that a majority of the vias are surrounded by the intermediate layer 120. As such, a majority of the sidewalls of the formed vias may have sidewalls sloped at the angle $\theta_2$. Vias formed in the via openings 128 may therefore have a more vertical profile. Improving the more vertical profile of vias may improve device reliability as device pitches continue to decrease.

Figure 8:
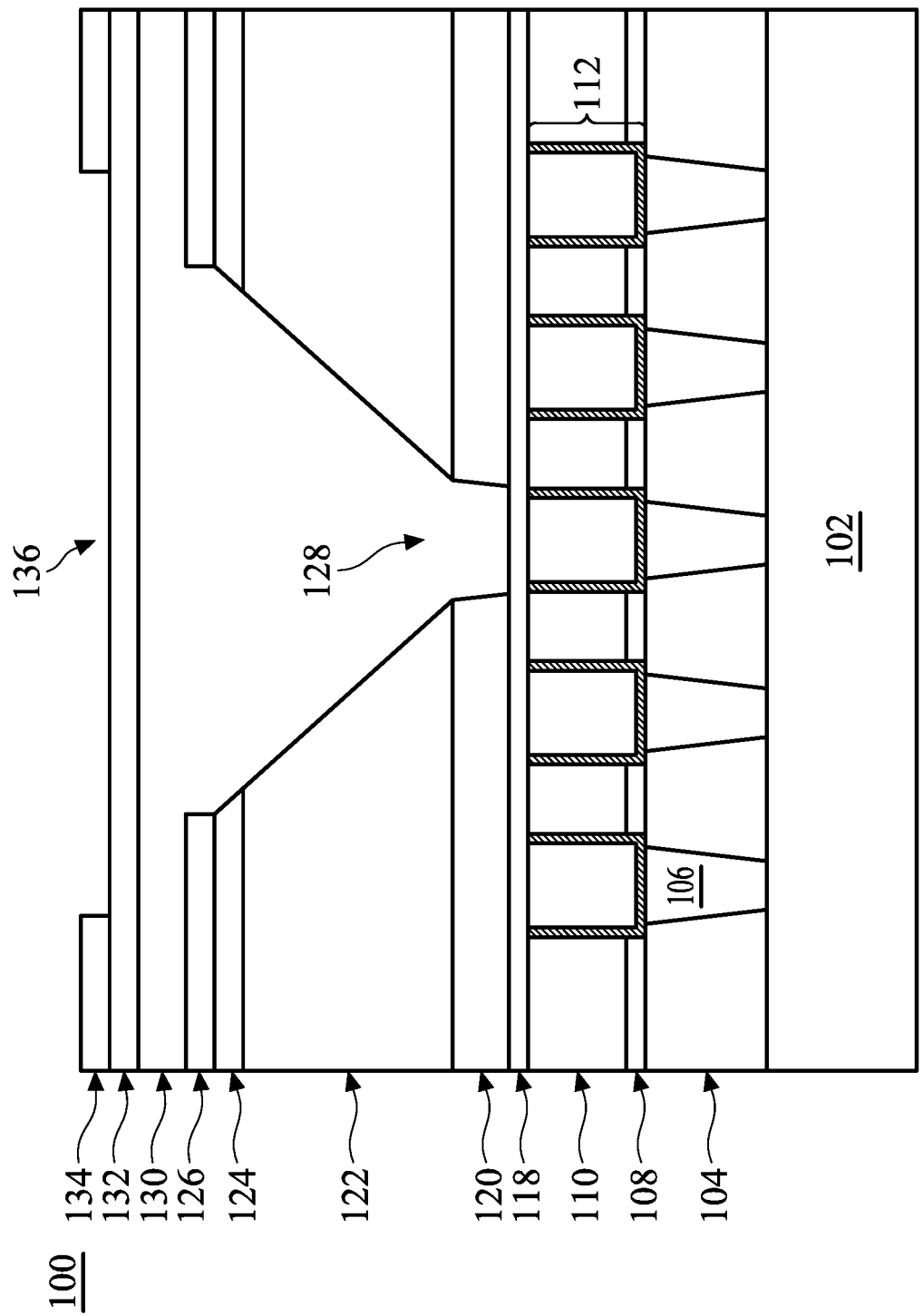

In FIG. 8, a photoresist is formed over the substrate 102. The photoresist may be a tri-layer photoresist that includes a bottom layer 130 in the via openings 128 and over the mask layer 126; a middle layer 132 over the bottom layer 130; and an upper layer 134 over the middle layer 132. The bottom layer 130 and upper layer 134 may be formed from photoresists, which include organic materials. The bottom layer 130 may be a bottom anti-reflective coating (BARC). The middle layer 132 may be formed from or include an inorganic material, which may be a nitride (such as silicon nitride), an oxynitride (such as silicon oxynitride), an oxide (such as silicon oxide), or the like. The upper layer 134 is a photosensitive material. The middle layer 132 has a high etching selectivity relative to the upper layer 134 and the bottom layer 130. As a result, the upper layer 134 is used as an etching mask for the patterning of the middle layer 132, and the middle layer 132 is used as an etching mask for the patterning of the bottom layer 130. In some embodiments, the photoresist formed over the substrate 102 may be another type of photoresist, such as a single-layer photoresist, a bi-layer photoresist, or the like.

The upper layer 134 is patterned using any suitable photolithography technique to form trench openings 136 therein. As an example of patterning the upper layer 134, a photomask (not shown) may be disposed over the upper layer 134, which may then be exposed to a radiation beam including an UV or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the top photoresist layer may be performed using an immersion lithography system to increase resolution and decrease the minimum achievable pitch. A bake or cure operation may be performed to harden the upper layer 134, and a developer may be used to remove either the exposed or unexposed portions of the upper layer 134 depending on whether a positive or negative resist is used.

Figure 9:
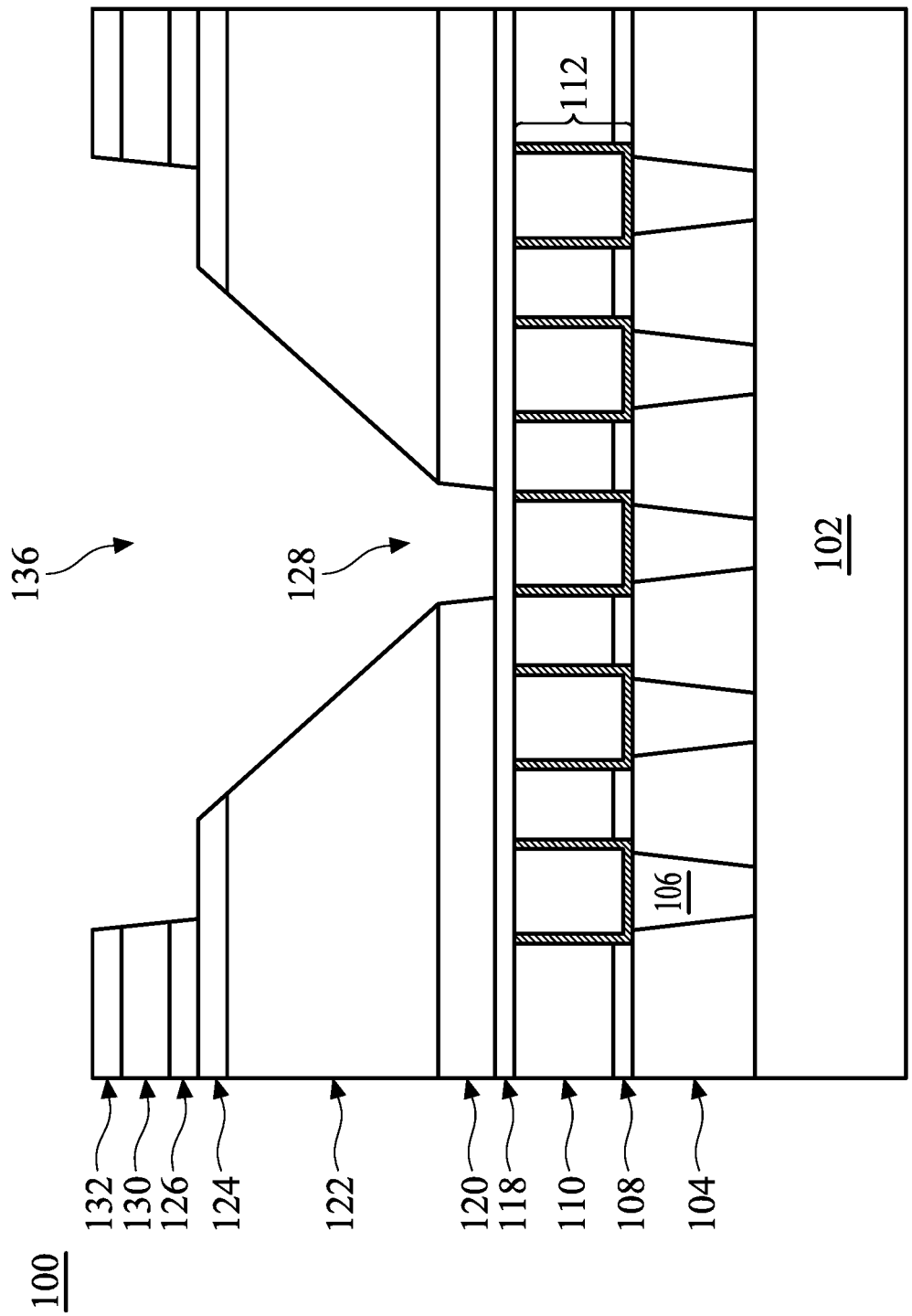

In FIG. 9, the pattern of the upper layer 134 is transferred to the middle layer 132 using an acceptable etching process. In some embodiments, the middle layer 132 may be trimmed, to increase the side of the trench openings 136 in the middle layer 132. After the trimming process, an acceptable etching process is performed to transfer the pattern of the middle layer 132 to the bottom layer 130, thereby extending the trench openings 136 through the bottom layer 130.

Further, the pattern of the bottom layer 130 is transferred to the mask layer 126 using an acceptable etching process. In an embodiment, the etching process used to etch the bottom layer 130 is continued to etch the mask layer 126. During the etching process, the upper layer 134, middle layer 132, and bottom layer 130 may be consumed. In some embodiments, an ashing process may be performed to remove remaining residue of the bottom layer 130.

Figure 10:
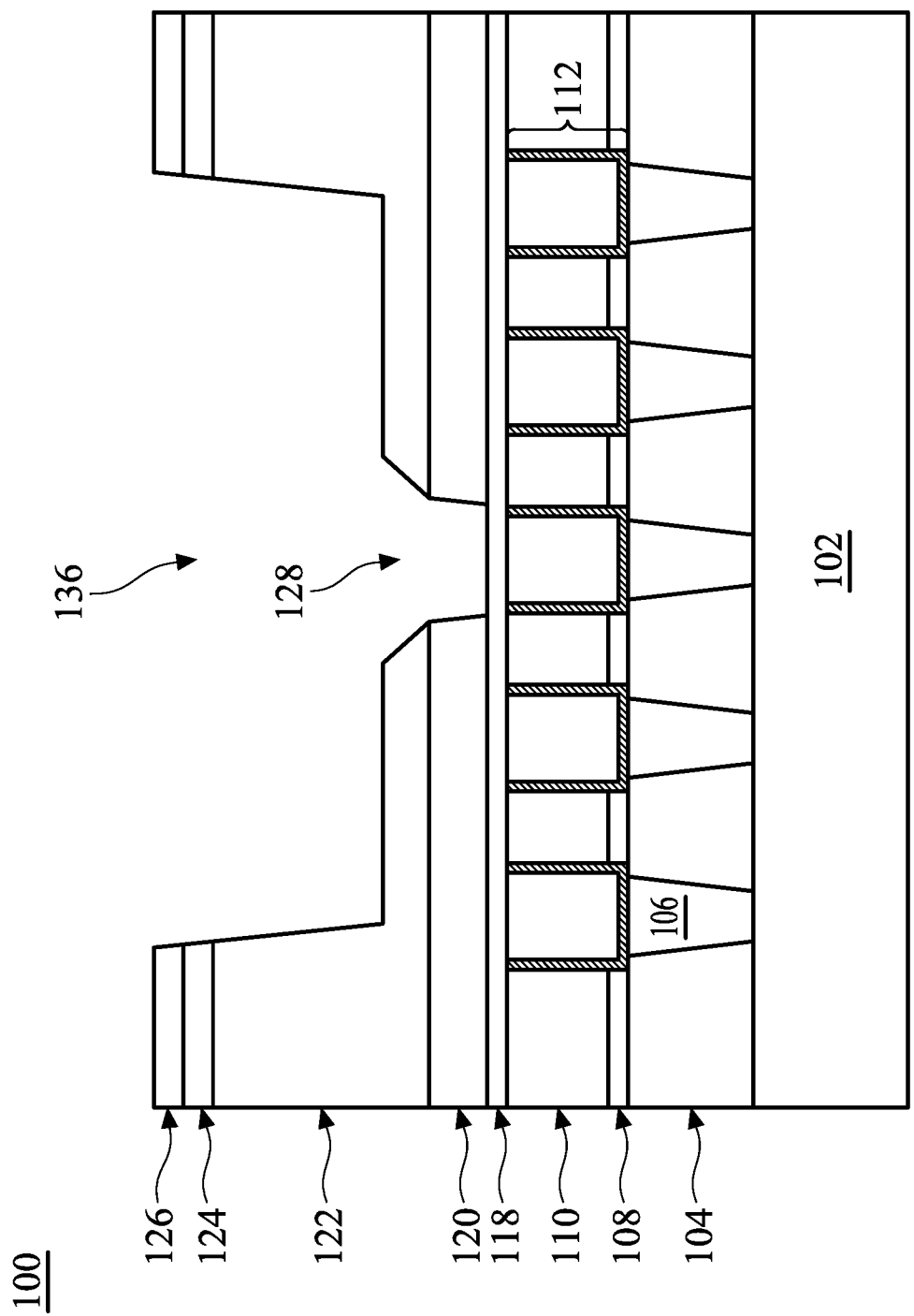

In FIG. 10, the trench openings 136 are extended through the buffer layer 124 and partially through the IMD 122. The trench openings 136 may be extended by using acceptable etching techniques, such as an anisotropic etching process. In an embodiment, the etching process used to pattern the mask layer 126 may be continued to etch the buffer layer 124 and IMD 122. In an embodiment, the etching process may be a separate etching process. In an embodiment, the etching process used to pattern the mask layer 126 may be similar to the etching process used to form the via openings 128 in the intermediate layer 120 and IMD 122 (e.g., the same etchants and/or other etching process parameters may be used). The trench openings 136 are extended such that they extend from the top surface of the IMD 122 to an intermediate level between the top surface and the bottom surface of the IMD 122. Extending the trench openings 136 to such as depth may be performed using a time-mode, and may be stopped after the etching has been performed for a predetermined period of time. Other etch and stop point detection techniques are also contemplated.

Figure 11:
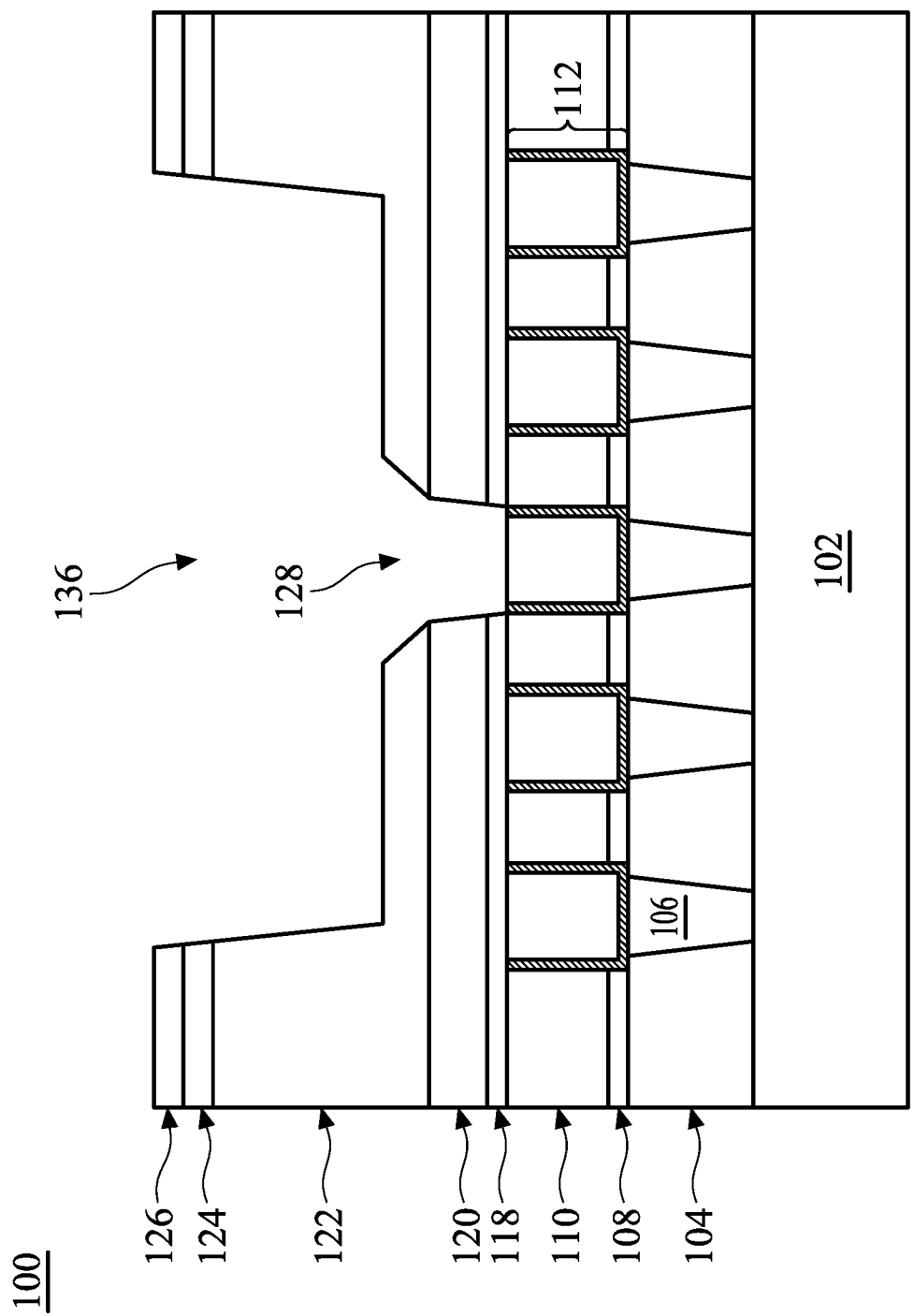

In FIG. 11, portions of the etch stop layer 118 in the via openings 128 are removed to expose the underlying target conductive lines 112 and associated metal caps (if any). The etch stop layer 118 may be removed using an anisotropic wet or dry etch that is selective to the material of the etch stop layer 118. For example, the etch stop layer 118 may be remove using an anisotropic wet etch that uses etchant reactants such as $H_2O_2$. The etching process used to remove the etch stop layer 118 may be different from the etching processes used to form the via openings 128 and the trench openings 136 (e.g., different etchants and/or other etching process parameters may be used).

Figure 12:
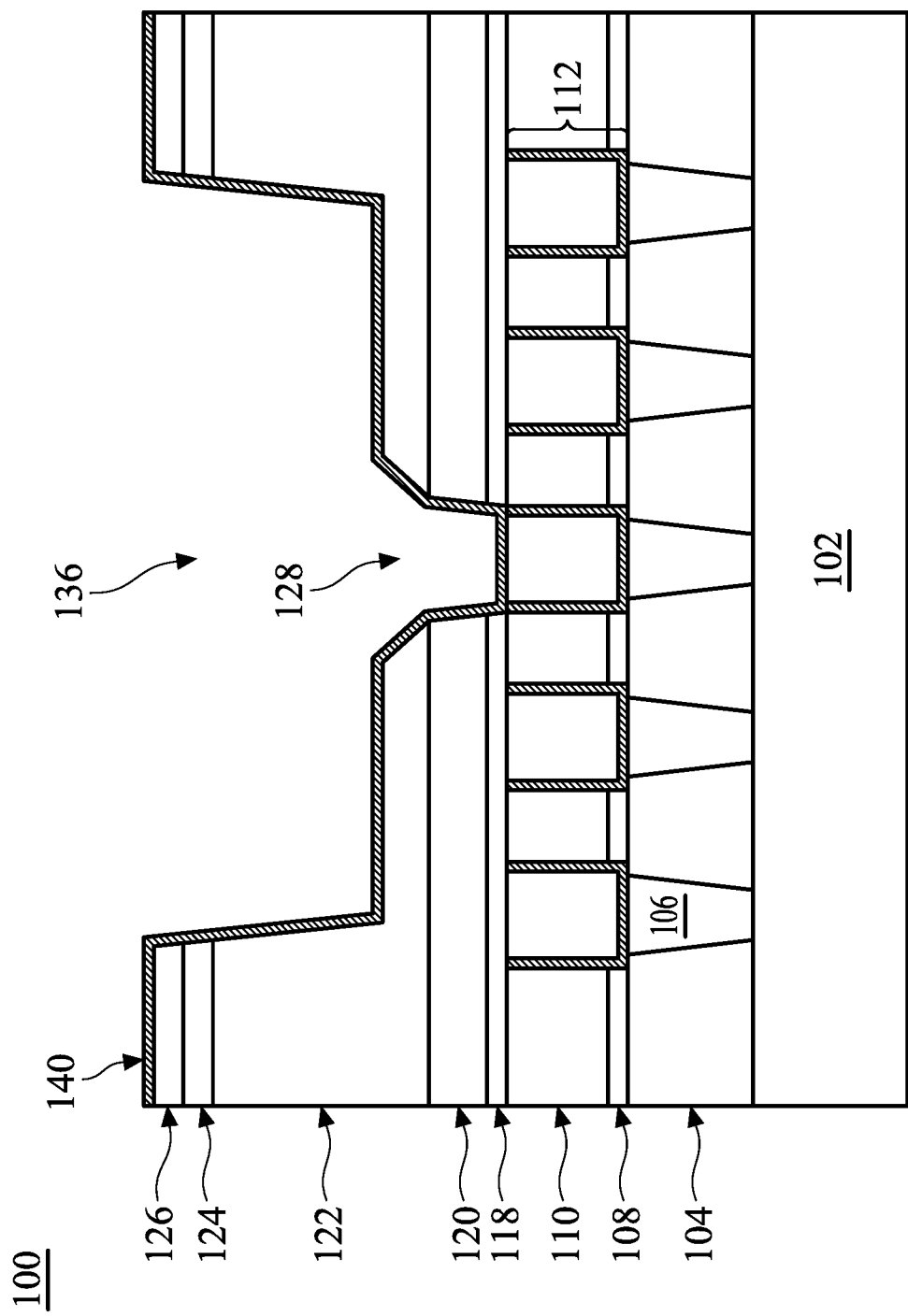

In FIG. 12, a diffusion barrier layer 140 is formed on the exposed surface of wafer 100. In accordance with some embodiments, the formation of the diffusion barrier layer 140 includes PVD. In some exemplary deposition process, Ar is introduced into the respective deposition chamber (not shown), in which wafer 100 is placed, to sputter metal ions (such as titanium or tantalum ($Ta^+$)) or atoms without charges (such as titanium or tantalum (Ta)) from the respective target (not shown) used in the PVD. Nitrogen may be added into the process gases. The sputtered metal ions are deposited onto wafer 100, forming the diffusion barrier layer 140, which is conductive. In the deposition of the diffusion barrier layer 140, a DC power and/or a radio frequency (RF) power may be applied. After deposition, the diffusion barrier layer 140 includes portions directly over the IMD 122, portions on the sidewalls of the trench openings 136, portion at the bottom of the via openings 128, portions on the bottoms of the trench openings 136, and portions on the sidewalls of the via openings 128.

Figure 13:
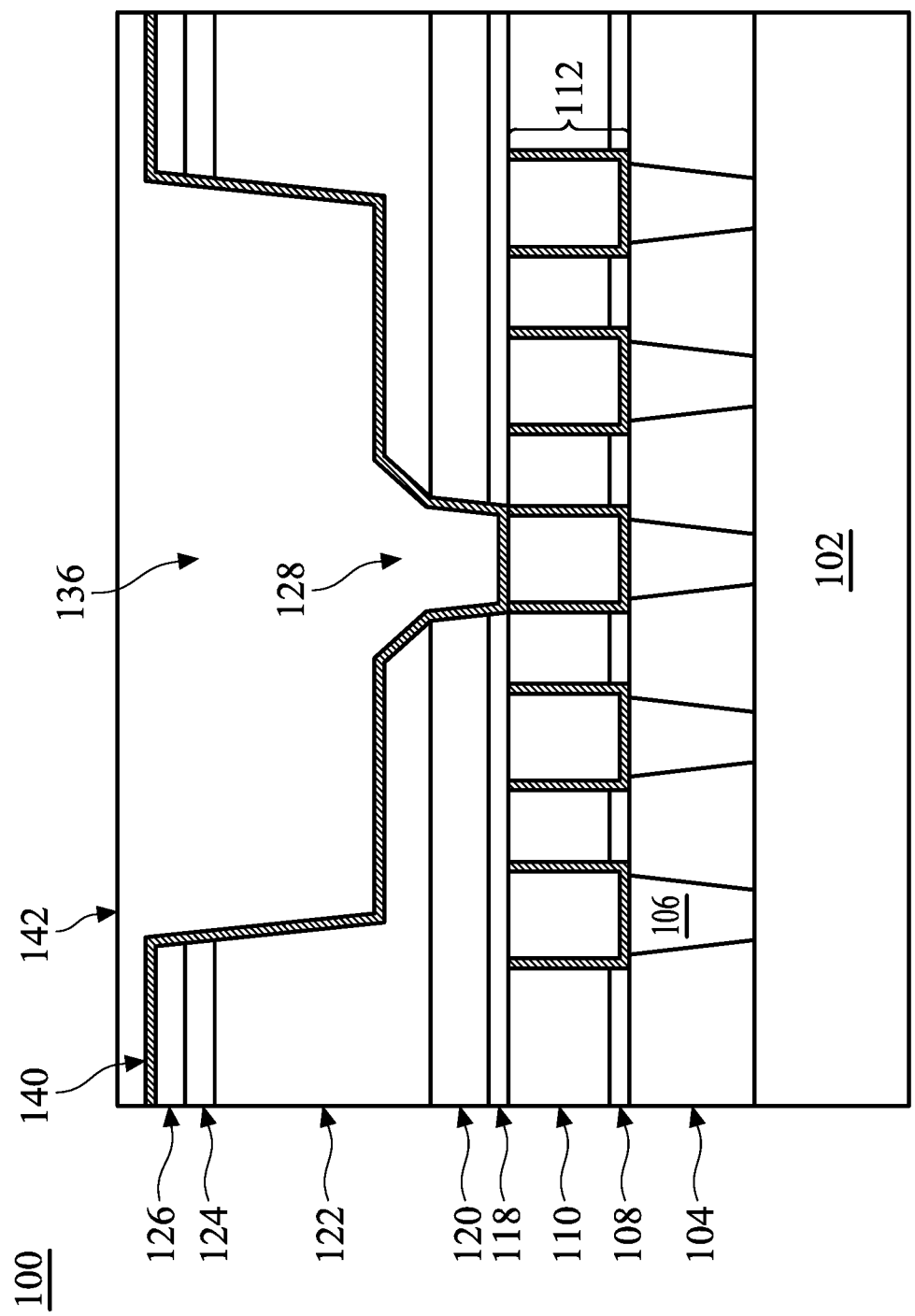

In FIG. 13, a conductive material 142 is filled into the via openings 128 and trench openings 136. Excess conductive material 142 may also be formed along top surfaces of the IMD 122. The conductive material 142 may be a metallic material including a metal or a metal alloy such as copper, silver, gold, tungsten, cobalt, aluminum, or alloys thereof. In some embodiments, the formation of the conductive material 142 includes depositing a thin seed layer (not shown), which may include copper or a copper alloy, and filling the rest of the via openings 128 and trench openings 136 using, for example, ECP or electro-less plating. A deposition method may also be contemplated.

Figure 14:
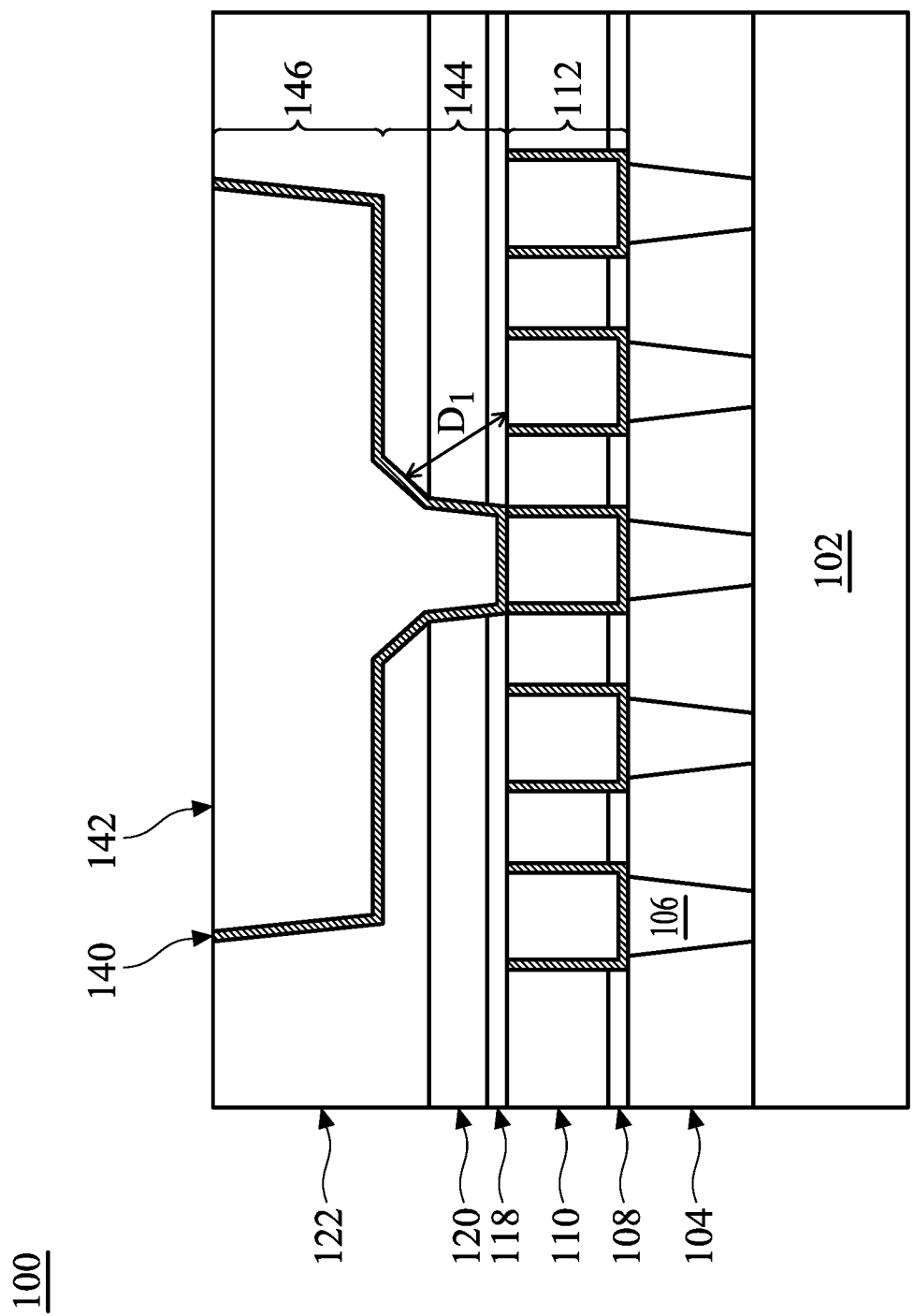

In FIG. 14, a planarization process may be performed to remove excess conductive material 142 and diffusion barrier layer 140, thereby forming vias 144 and conductive lines 146 in the via openings 128 and trench openings 136, respectively. The planarization process may be e.g., a grinding or a CMP, and may be performed such that the top surfaces of the conductive material 142, diffusion barrier layer 140, and IMD 122 are level or are substantially level. The vias 144 and conductive lines 146 include remaining portions of the conductive material 142 and diffusion barrier layer 140 extending along the sidewalls and bottoms of the conductive material 142. The vias 144 and conductive lines 146 are physically and electrically connected to the target conductive lines 112.

As explained above, the vias 144 have sidewalls with an improved vertical profile. The vias 144 may have a total vertical dimension (e.g., height) of about 20 nm. A majority (e.g., greater than about 50%) of the vertical dimension of the vias 144 may extend along and be surrounded by the intermediate layer 120. As such, the majority of the sidewalls of the vias 144 may be formed at a greater angle to the substrate 102. Improving the vertical profile of the vias 144 increases the distance $D_1$ between the vias 144 and conductive lines 112 that are adjacent the target conductive line 112. By increasing the distance $D_1$ between the vias 144 and adjacent conductive lines 112, leakage currents flowing between the vias 144 and adjacent conductive lines 112 may be reduced. This may increase the breakdown voltage of the materials (e.g., the IMD 122 and intermediate layer 120) insulating the vias 144 from adjacent conductive lines 112. Improving the vertical profile of the vias 144 may also increase the size of the processing window for electrical testing of the formed semiconductor devices.

After formation of the vias 144 and conductive lines 146 in the dielectric layers (e.g., the intermediate layer 120 and IMD 122), subsequent steps for back end of line processing of the wafer 100 may be performed. For example, the dual damascene process may be continued to form subsequent dielectric layers, vias, and lines in the interconnect structure. External connections may be formed connected to the topmost layers of the interconnect structure, and may include microbumps, conductive pads, underbump metallization structures, solder connectors, and/or the like.

FIGS. 15 through 27 illustrate cross-sectional views of intermediate stages in the formation of interconnect structures of integrated circuits, in accordance with some embodiments. FIGS. 15 through 27 may illustrate formation of the interconnect structures using a dual damascene process. FIGS. 15 through 27 illustrate embodiments where a via opening is formed after a trench opening, which may be referred to as a "via last" process. Although FIGS. 15 through 27 illustrate the formation of a single via and conductive trench, it should be appreciated that many vias and conductive trenches may be simultaneously formed in the steps shown.

Some features of the embodiments shown in FIGS. 15 through 27 are similar to features of the embodiments shown in FIGS. 1 through 14. Corresponding numerals and symbols in FIGS. 15 through 27 generally refer to corresponding parts from FIGS. 1 through 14, unless otherwise indicated. Details about the formation of similar features are not repeated herein.

Figure 15:
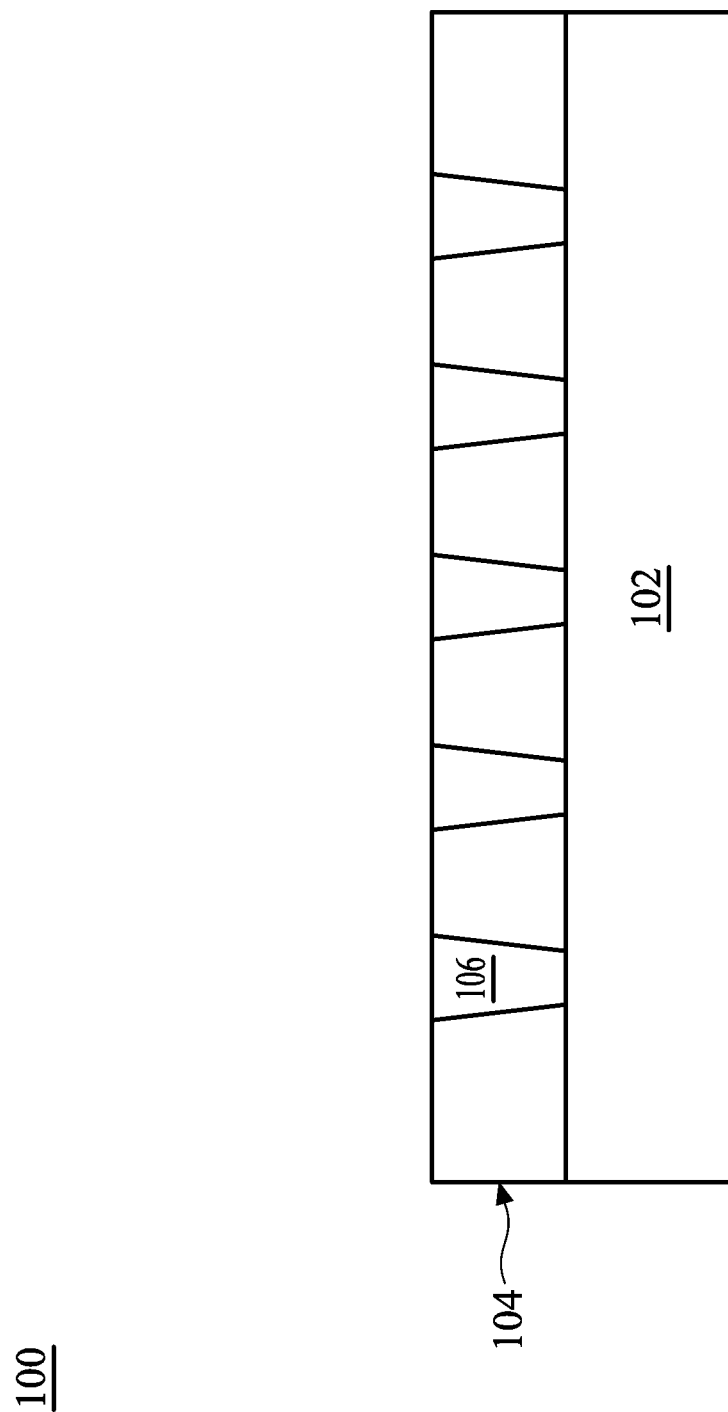
FIGS. 15, 16, 17, 18, 19, 20, 21, 22, 23, 24, 25, 26, and 27 illustrate cross-sectional views of intermediate stages in the formation of interconnect structures of integrated circuits, in accordance with some embodiments.

In FIG. 15, the wafer 100 is provided, which includes the substrate 102. The ILD 104 is formed over the substrate 102, and contact plugs 106 are formed in the ILD 104.

Figure 16:
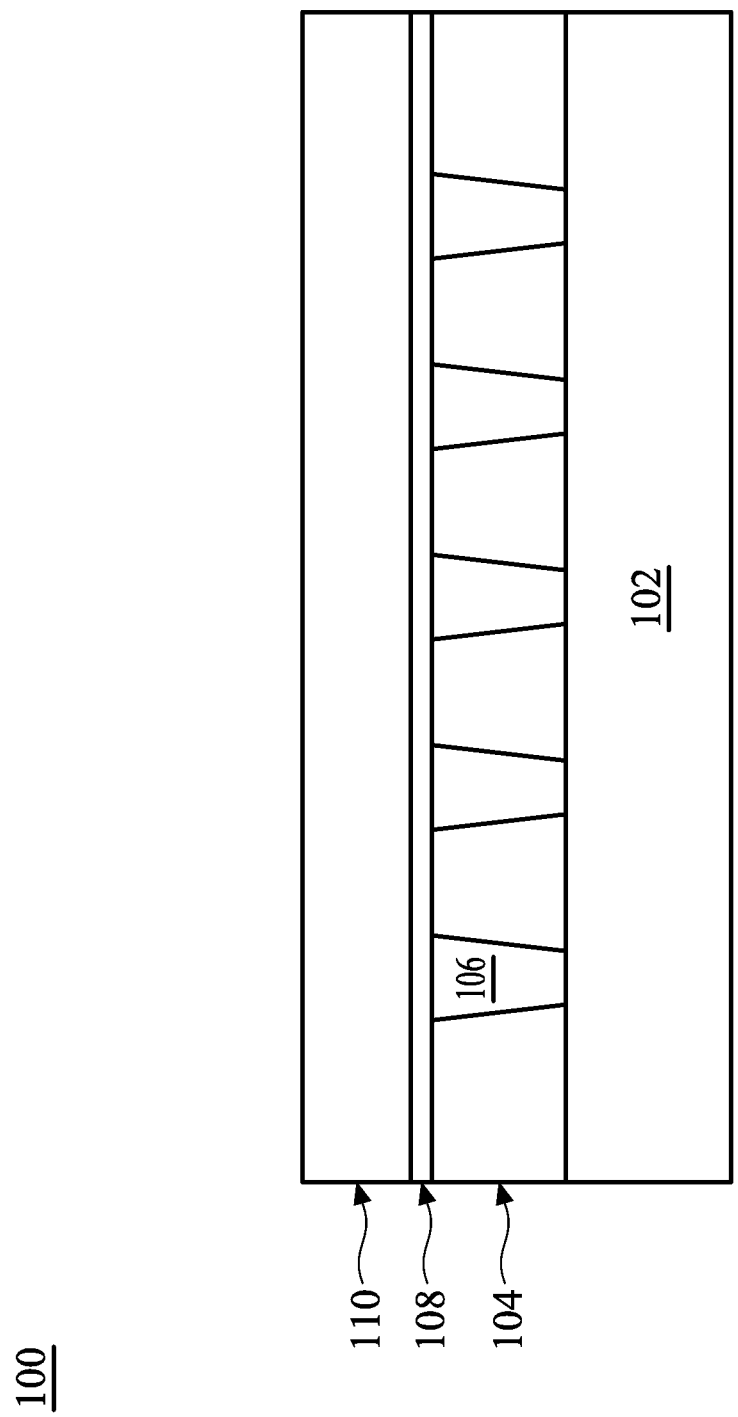

In FIG. 16, the etch stop layer 108 is formed over the integrated circuit devices of the substrate 102 (if any), ILD 104, and contact plugs 106. The IMD 110 is formed over the etch stop layer 108.

Figure 17:
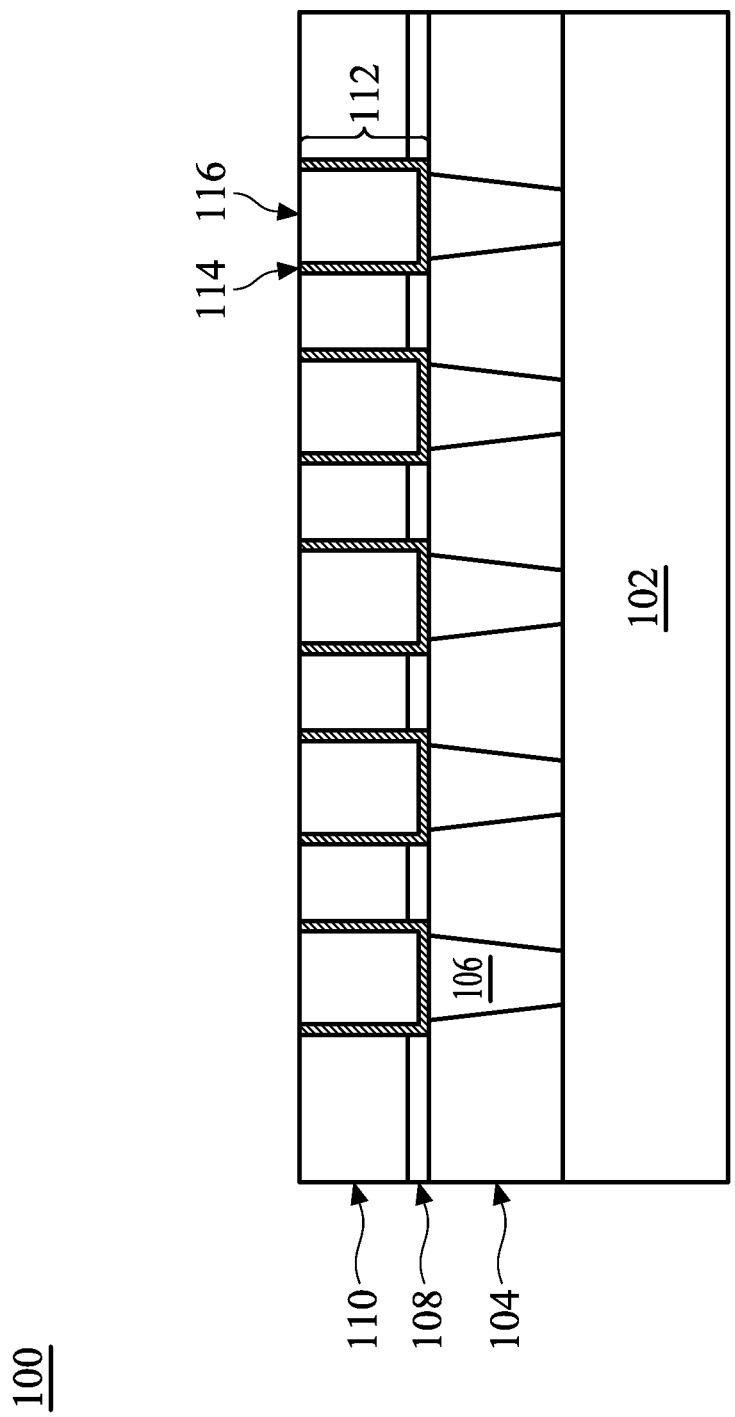

In FIG. 17, the conductive lines 112 are formed in the IMD 110. The conductive lines 112 include the diffusion barrier layers 114 and conductive material 116, which are formed in openings of the IMD 110.

Figure 18:
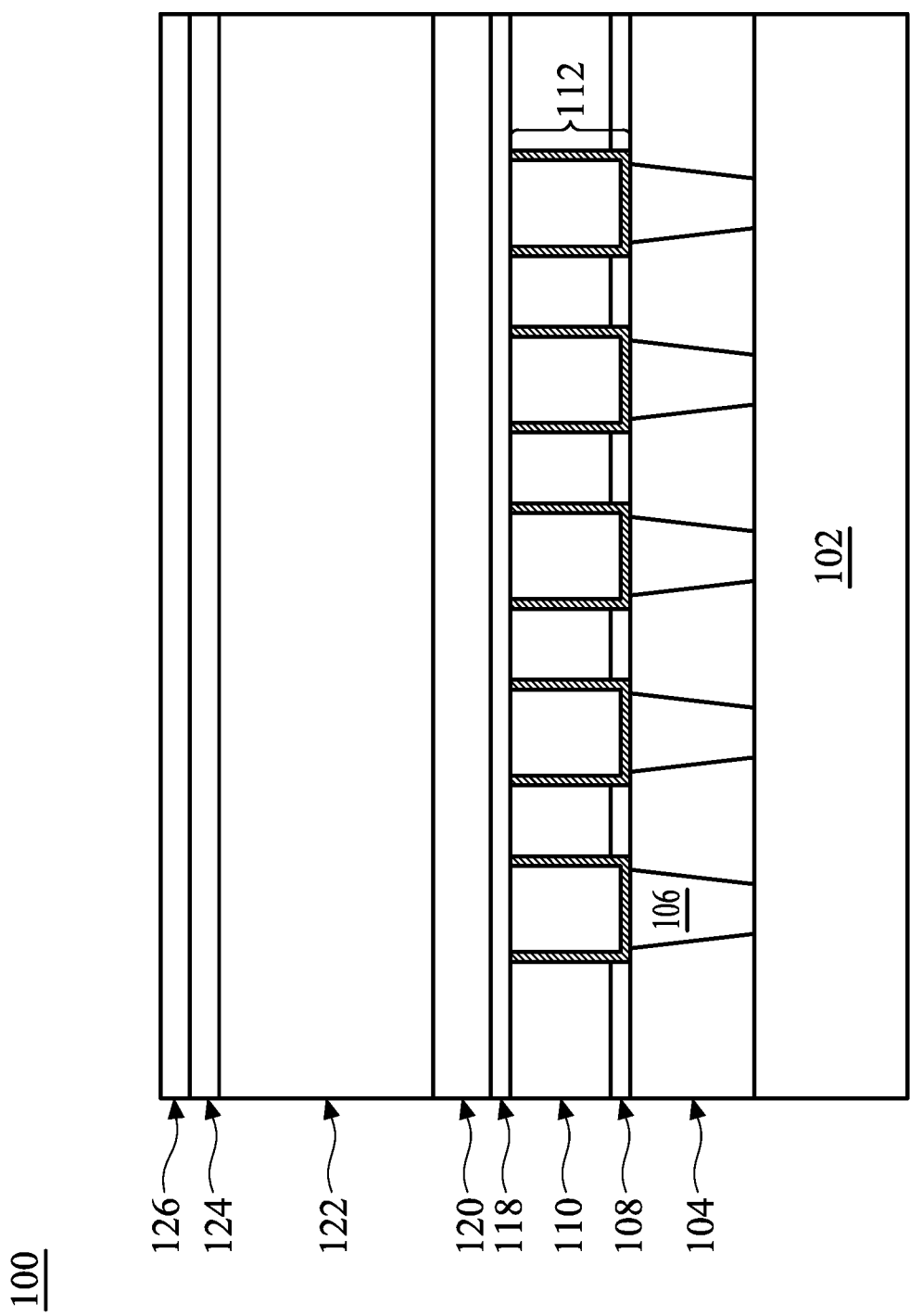

In FIG. 18, the film stack is formed over the IMD 110 and conductive lines 112. The film stack includes the etch stop layer 118, the intermediate layer 120, the IMD 122, the buffer layer 124, and the mask layer 126.

Figure 19:
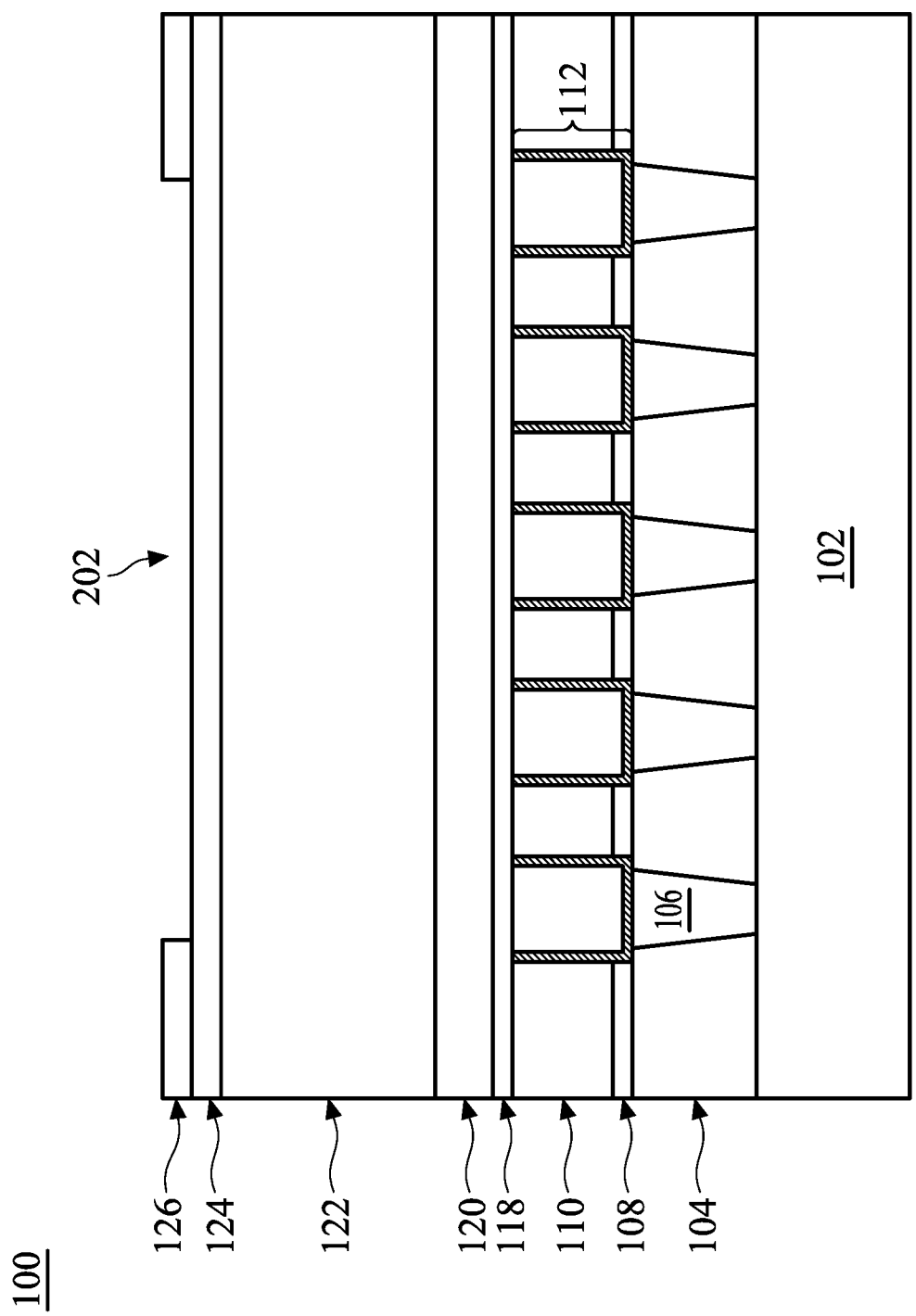

In FIG. 19, trench openings 202 are formed in the mask layer 126. Formation of the trench openings 202 may include performing acceptable photolithography and etching processes to etch the mask layer 126 in order to form initial trench openings.

Figure 20:
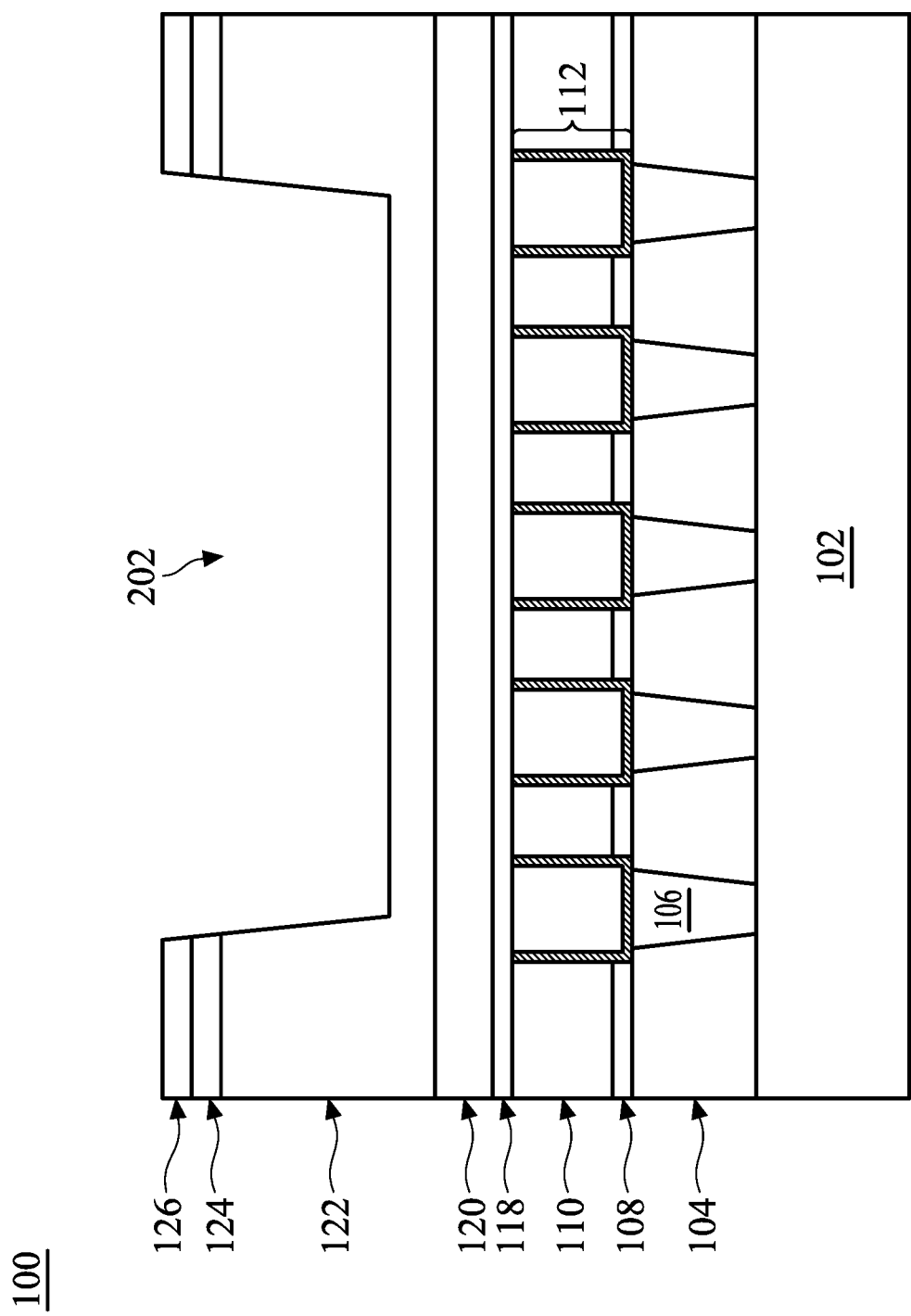

In FIG. 20, the trench openings 202 are extended through the buffer layer 124 and IMD 122. The trench openings 202 may be extended by using acceptable etching techniques, such as the anisotropic dry etch process discussed above with respect to formation of the via openings 128. The etching process may be performed using a time-mode, and may be stopped after the etching has been performed for a predetermined period of time. Other etch and stop point detection techniques are also contemplated.

Figure 21:
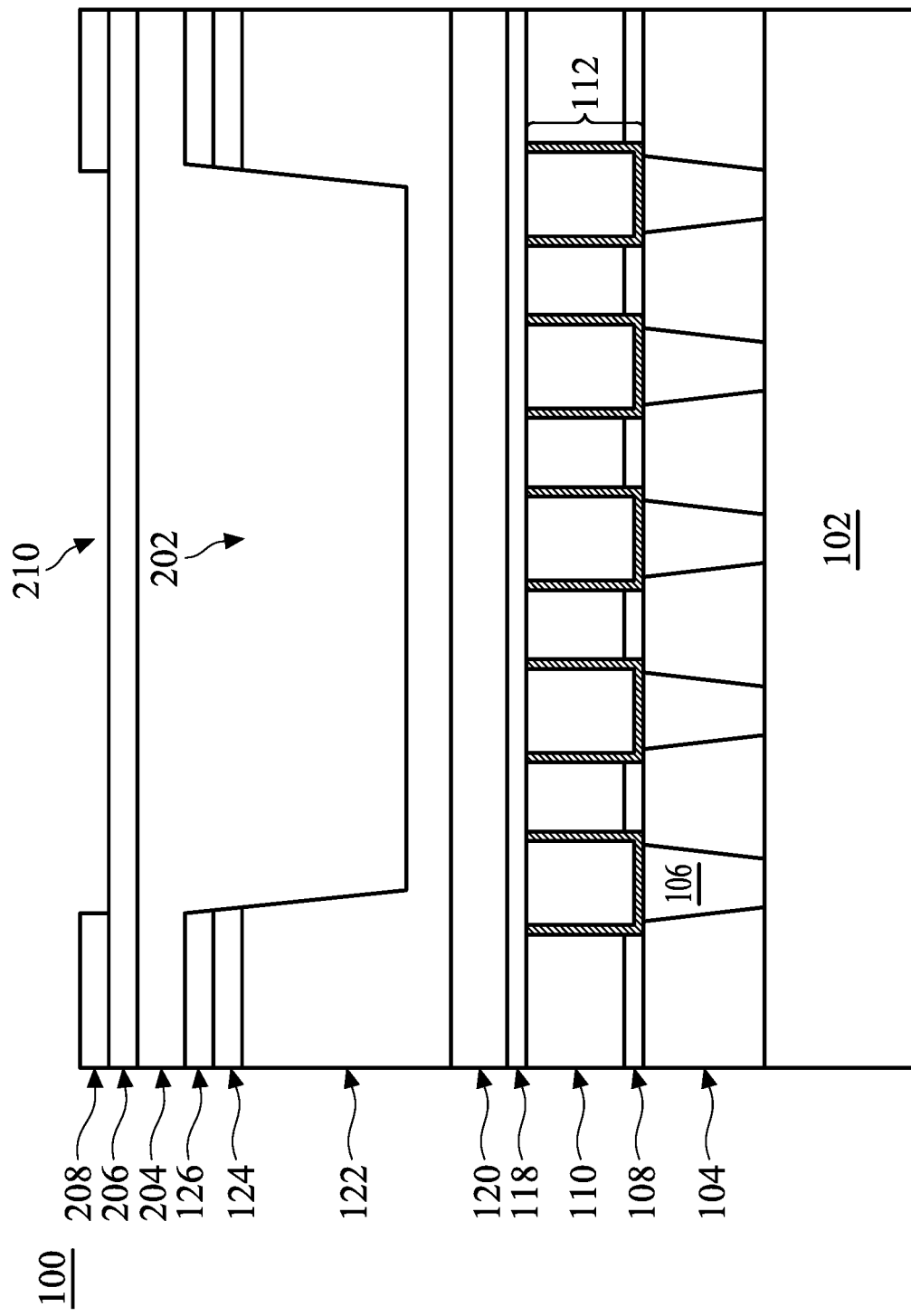

In FIG. 21, a photoresist is formed over the substrate 102. The photoresist may be a tri-layer photoresist that includes a bottom layer 204 in the trench openings 202 and over the mask layer 126; a middle layer 206 over the bottom layer 204; and an upper layer 208 over the middle layer 206. The bottom layer 204, middle layer 206, and upper layer 208 may be formed of a material selected from the same candidate material of the bottom layer 130, middle layer 132, and upper layer 134, respectively, and may be formed using a method that is selected from the same group of candidate methods for forming the bottom layer 130, middle layer 132, and upper layer 134, respectively. The upper layer 134 is patterned using any suitable photolithography technique to form via openings 210 therein. In some embodiments, the photoresist formed over the substrate 102 may be another type of photoresist, such as a single-layer photoresist, a bi-layer photoresist, or the like.

Figure 22:
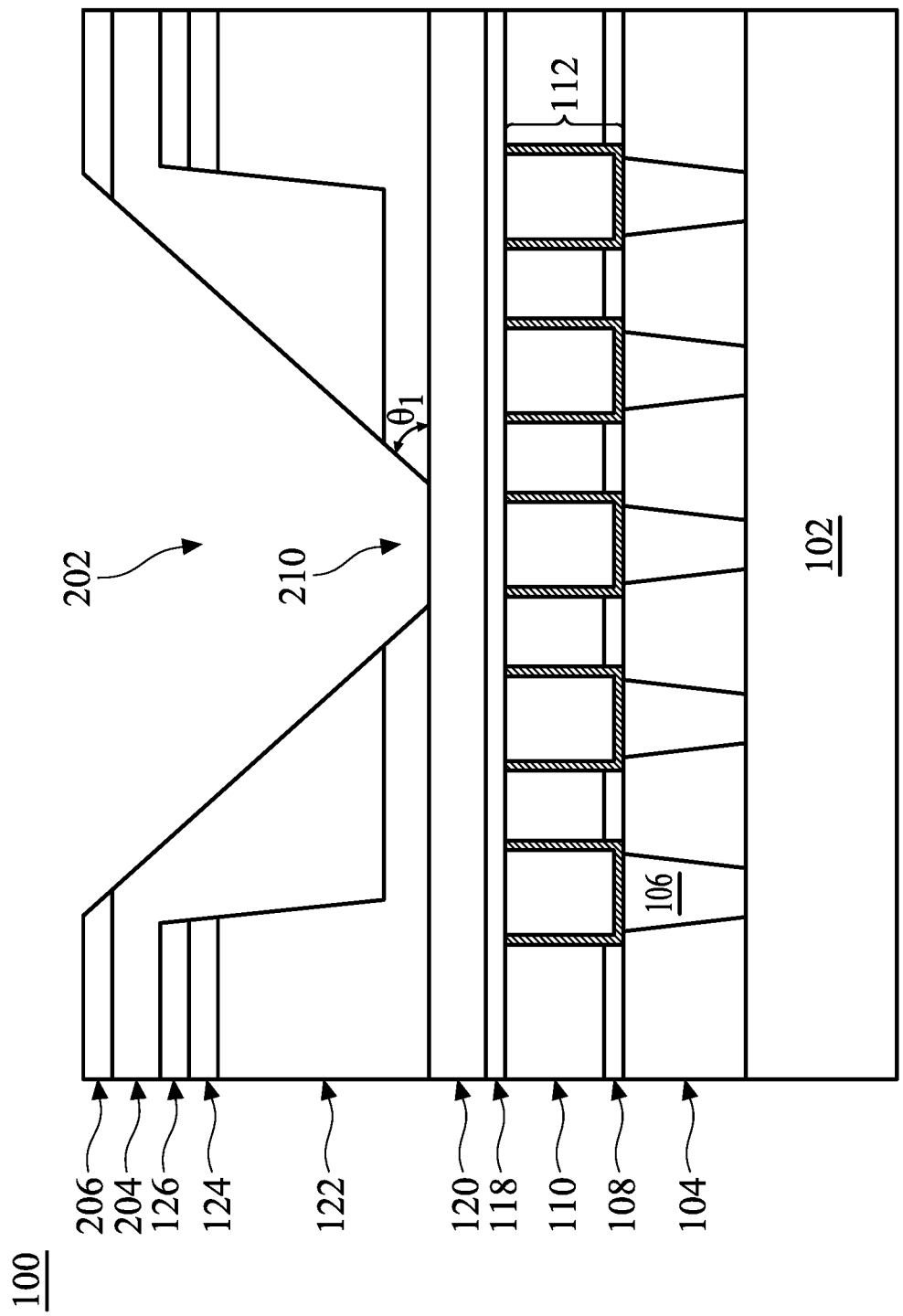

In FIG. 22, the pattern of the via openings 210 in the upper layer 208 is transferred to the middle layer 206, the bottom layer 204, and the IMD 122 in one or more etching processes. In some embodiments, the middle layer 206 may be trimmed, to increase the size of the via openings 210 in the middle layer 206. The bottom layer 204, middle layer 206, and upper layer 208 may be removed during or after the etching of the IMD 122. The sidewalls of the via openings 210 in the IMD 122 form the angles $\theta_1$ with a plane parallel to the major surface of the substrate 102.

Figure 23:
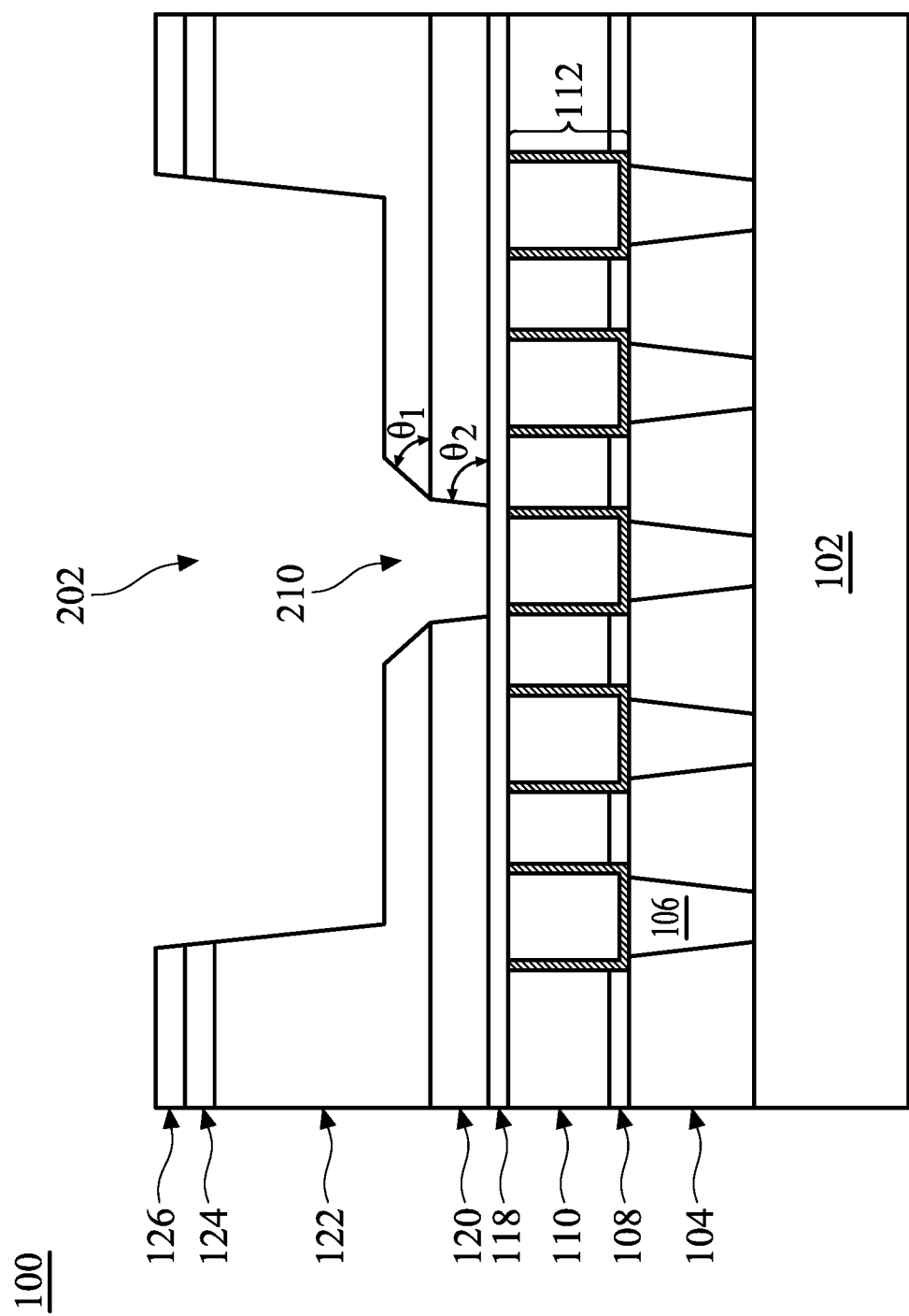

In FIG. 23, the via openings 210 are extended through the intermediate layer with an etching process 120 until the etch stop layer 118 is exposed. The etching process used to extend the via openings 210 through the intermediate layer 120 uses the same etching process parameters (e.g., the same etchants) as the etching process used to etch the IMD 122. In an embodiment, the etching process used to etch the IMD 122 is continued to extend the via openings 210 through the intermediate layer 120. The sidewalls of the via openings 128 in the intermediate layer 120 form the angles $\theta_2$ with a plane parallel to the major surface of the substrate 102.

Figure 24:
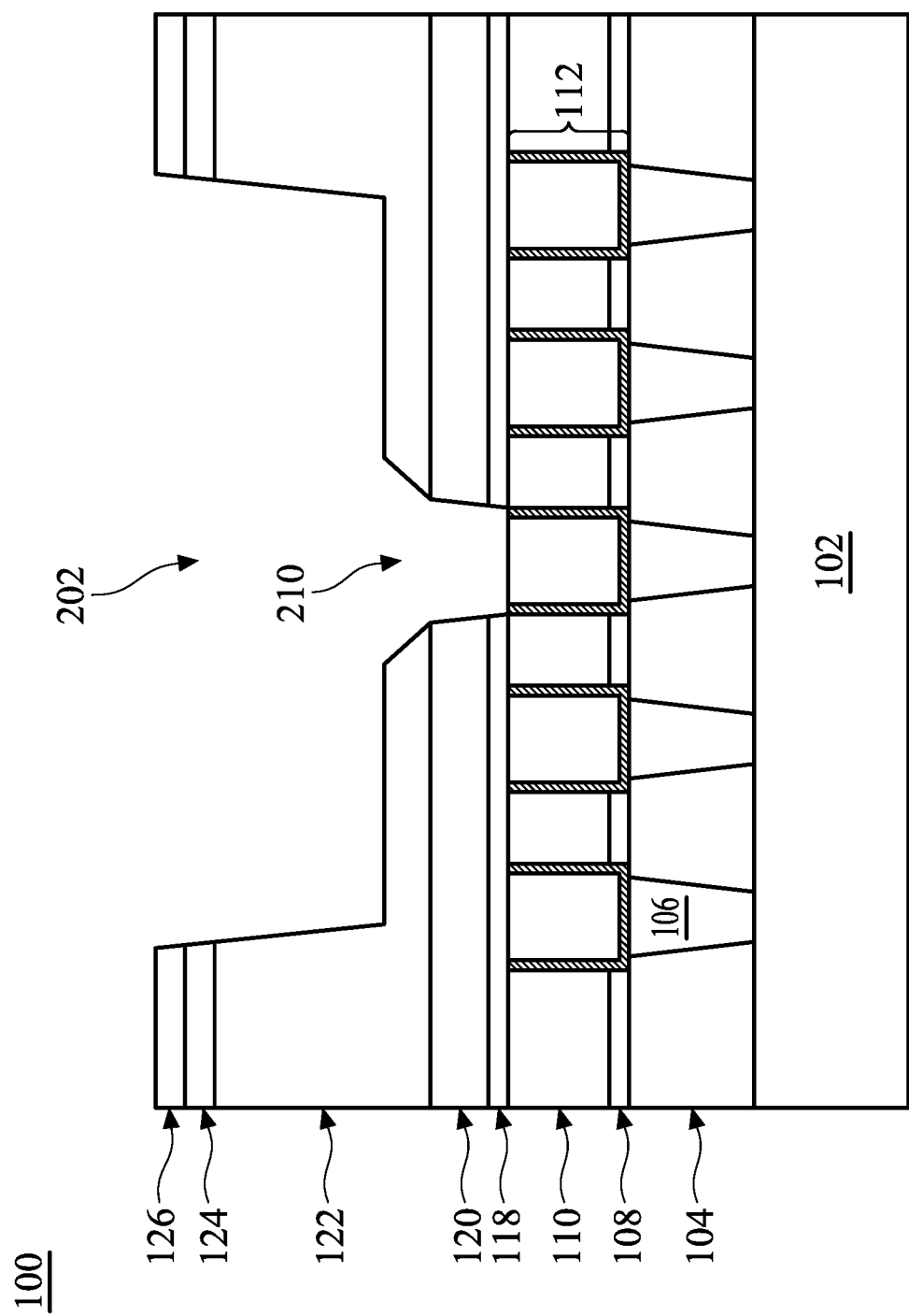

In FIG. 24, portions of the etch stop layer 118 in the via openings 210 are removed to expose the underlying target conductive lines 112 and associated metal caps (if any). The etch stop layer 118 may be removed using an anisotropic wet or dry etch that is selective to the material of the etch stop layer 118. The etching process used to remove the etch stop layer 118 may be different from the etching processes used to form the via openings 210 and the trench openings 202 (e.g., different etchants and/or different other etching process parameters may be used).

Figure 25:
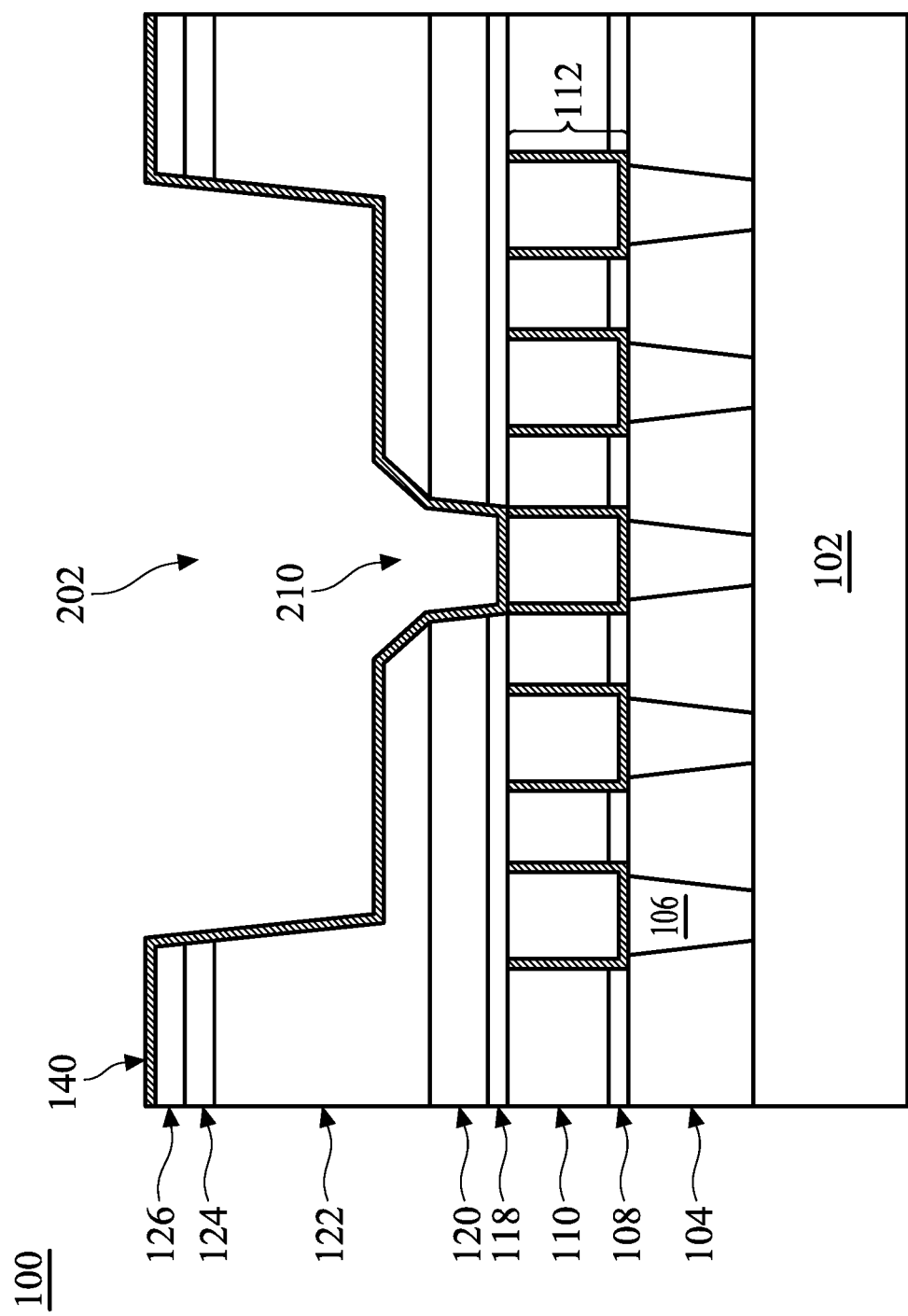

In FIG. 25, the diffusion barrier layer 140 is formed on the exposed surface of wafer 100. After deposition, the diffusion barrier layer 140 includes portions directly over the IMD 122, portions on the sidewalls of the trench openings 202, portion at the bottom of the via openings 210, portions on the bottoms of the trench openings 202, and portions on the sidewalls of the via openings 210.

Figure 26:
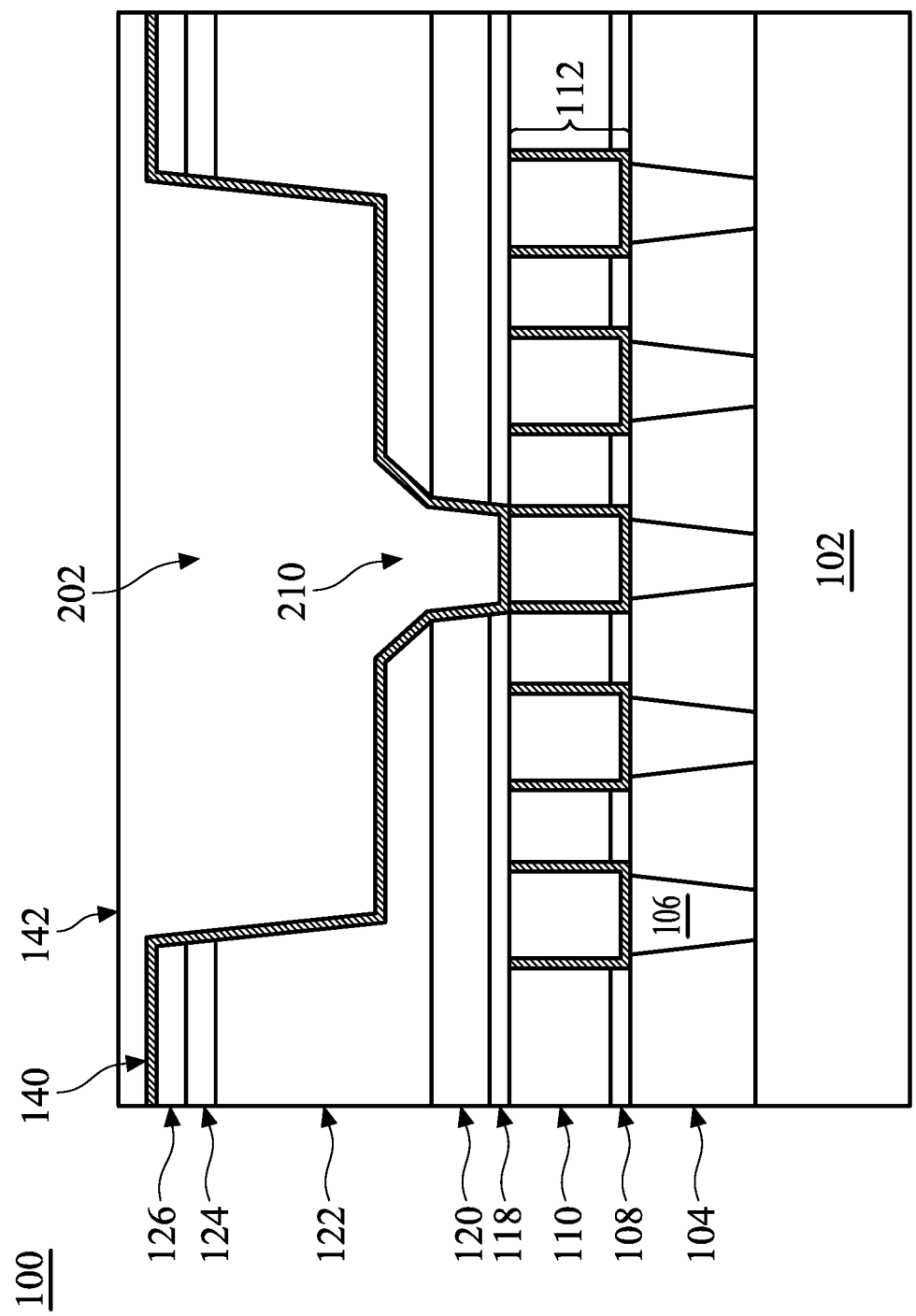

In FIG. 26, the conductive material 142 is filled into the via openings 210 and trench openings 202. Excess conductive material 142 may also be formed along top surfaces of the IMD 122.

Figure 27:
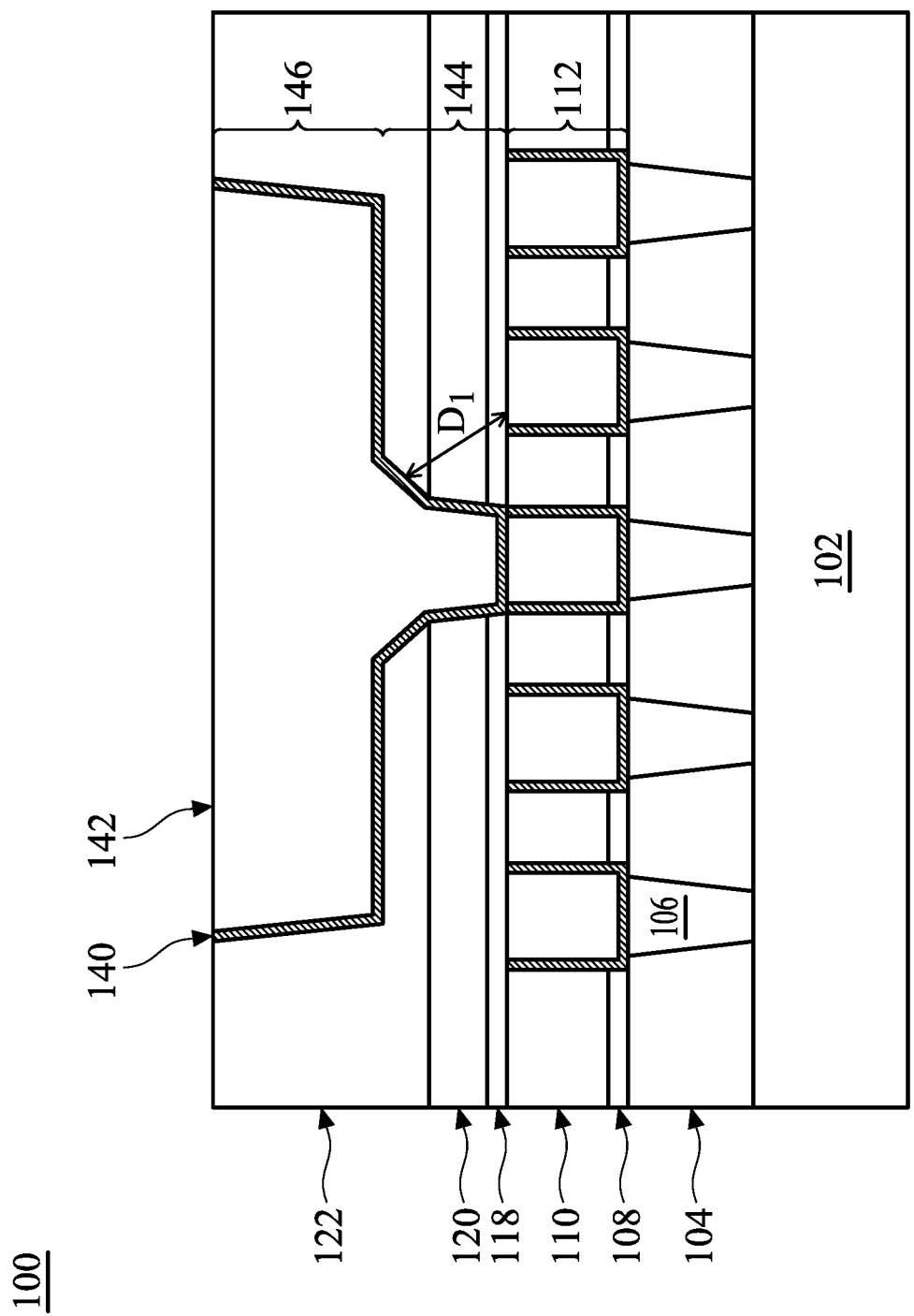

In FIG. 27, a planarization process may be performed to remove excess conductive material 142 and diffusion barrier layer 140, thereby forming the vias 144 and conductive lines 146 in the via openings 210 and trench openings 202, respectively. After formation of the vias 144 and conductive lines 146 in the dielectric layers (e.g., the intermediate layer 120 and IMD 122), subsequent steps for back end of line processing of the wafer 100 may be performed.

By forming the vias 144 through the intermediate layer 120, which has a different etching rate than the IMD 122, sidewalls of the vias 144 may have an improved vertical profile. The improved vertical profile may reduce leakage currents in the interconnect structure and increase breakdown voltages of the interconnect structure, and may also increase the processing window size for electrical testing.

In an embodiment, a method includes: forming a first conductive line over a substrate; depositing a first dielectric layer over the first conductive line; depositing a second dielectric layer over the first dielectric layer, the second dielectric layer including a different dielectric material than the first dielectric layer; patterning a via opening in the first dielectric layer and the second dielectric layer, where the first dielectric layer is patterned using first etching process parameters, and the second dielectric layer is patterned using the first etching process parameters; patterning a trench opening in the second dielectric layer; depositing a diffusion barrier layer over a bottom and along sidewalls of the via opening, and over a bottom and along sidewalls of the trench opening; and filling the via opening and the trench opening with a conductive material.

In some embodiments, the patterning the via opening in the first dielectric layer and the second dielectric layer includes: continuously etching the first dielectric layer and the second dielectric layer with the first etching process parameters. In some embodiments, the method further includes: forming an etch stop layer over the first conductive line, the first dielectric layer formed over the etch stop layer. In some embodiments, the method further includes: after the patterning the via opening and the forming the trench opening, removing a portion of the etch stop layer exposed by the via opening, the portion of the etch stop layer removed using second etching process parameters different from the first etching process parameters. In some embodiments, the first dielectric layer and the second dielectric layer have etch selectivity with the etch stop layer relative the first etching process parameters. In some embodiments, the forming the trench opening in the second dielectric layer includes: after the patterning the via opening in the first dielectric layer and the second dielectric layer, forming a photoresist in and over the via opening; patterning the photoresist with a pattern for the trench opening; and etching the trench opening in the second dielectric layer using the photoresist as an etching mask. In some embodiments, the patterning the via opening in the first dielectric layer and the second dielectric layer includes: after the forming the trench opening in the second dielectric layer, forming a photoresist in and over the trench opening; patterning the photoresist with a pattern for the via opening; and etching the via opening in the first dielectric layer and the second dielectric layer using the photoresist as an etching mask. In some embodiments, the method further includes: planarizing the conductive material such that top surfaces of the conductive material, the diffusion barrier layer, and the second dielectric layer are level. In some embodiments: sidewalls of the via opening in the first dielectric layer form a first angle with a plane parallel to a major surface of the substrate; sidewalls of the via opening in the second dielectric layer form a second angle with the plane parallel to the major surface of the substrate; and the first angle is greater than the second angle. In some embodiments, the first angle is from 70° to 80°, and the second angle is from 45° to 50°.

In an embodiment, a method includes: forming a first conductive line over a substrate; depositing an etch stop layer over the first conductive line; forming a plurality of dielectric layers over the etch stop layer; patterning a via opening extending into at least a portion of each of the plurality of dielectric layers and exposing the etch stop layer, the via opening formed through each of the dielectric layers using first etching process parameters; removing portions of the etch stop layer to expose the first conductive line; depositing a diffusion barrier layer over the dielectric layers, along sidewalls of the via opening, and over the first conductive line; forming a conductive material over the diffusion barrier layer and in the via opening; and planarizing the conductive material such that top surfaces of the conductive material, the diffusion barrier layer, and a topmost dielectric layer of the dielectric layers are level.

In some embodiments, the patterning the via opening includes: continuously etching at least a portion of each of the plurality of dielectric layers with the first etching process parameters. In some embodiments: sidewalls of the via opening in the topmost dielectric layer form a first angle with a plane parallel to a major surface of the substrate; sidewalls of the via opening in a bottommost dielectric layer form a second angle with the plane parallel to the major surface of the substrate; and the second angle is greater than the first angle. In some embodiments, the method further includes: before the patterning the via opening, forming a trench opening extending through a portion of the plurality of dielectric layers. In some embodiments, the method further includes: after the patterning the via opening, forming a trench opening extending through a portion of the plurality of dielectric layers.

In an embodiment, a structure includes: a first conductive line over a substrate including active devices; an etch stop layer over the first conductive line; a first dielectric layer over the etch stop layer; a second dielectric layer over the first dielectric layer; a via extending through the etch stop layer, the first dielectric layer, and the second dielectric layer, the via having sidewalls, where portions of the sidewalls in the first dielectric layer form a first angle with a plane parallel to a major surface of the substrate, portions of the sidewalls in the second dielectric layer form a second angle with the plane parallel to the major surface of the substrate, and the first angle is greater than the second angle; and a second conductive line over the via, the second conductive line electrically connected to the active devices of the substrate through the via and the first conductive line.

In some embodiments, the first dielectric layer has a k-value of from 3 to 8, and the second dielectric layer has a k-value of from 2 to 4. In some embodiments, the first dielectric layer includes silicon oxide, and the etch stop layer includes silicon nitride. In some embodiments, the first dielectric layer includes silicon oxide doped with C, H, or N. In some embodiments, the first dielectric layer and the second dielectric layer have an etching rate ratio of from 2 to 3 relative a same etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an inter-layer dielectric (ILD) over a substrate comprising an active device;
   forming a contact plug in the ILD, the contact plug being electrically connected to the active device of the substrate;
   forming a first conductive line over and electrically connected to the contact plug;
   depositing a first dielectric layer over the first conductive line;
   depositing a second dielectric layer over the first dielectric layer, the second dielectric layer comprising a different dielectric material than the first dielectric layer;
   patterning a via opening in the first dielectric layer and the second dielectric layer with a first etching process, the first dielectric layer and the second dielectric layer being continuously etched during the first etching process, a first portion of the first dielectric layer being covered by the second dielectric layer before the first etching process, the first portion of the first dielectric layer being removed after the first etching process, the via opening extending from an intermediate level of the second dielectric layer to a top surface of the first conductive line;
   patterning a trench opening in the second dielectric layer, the trench opening extending from a top surface of the second dielectric layer to the intermediate level of the second dielectric layer, the trench opening being wider than the via opening;
   depositing a diffusion barrier layer over a bottom and along sidewalls of the via opening, and over a bottom and along sidewalls of the trench opening; and
   filling the via opening and the trench opening with a conductive material.

2. The method of claim 1, further comprising:
   forming an etch stop layer over the first conductive line, the first dielectric layer formed over the etch stop layer.

3. The method of claim 2, further comprising:
   after the patterning the via opening and the forming the trench opening, removing a portion of the etch stop layer exposed by the via opening, the portion of the etch stop layer removed using a second etching process different from the first etching process.

4. The method of claim 2, wherein the first dielectric layer and the second dielectric layer have etch selectivity with the etch stop layer relative the first etching process.

5. The method of claim 1, wherein the forming the trench opening in the second dielectric layer comprises:
   after the patterning the via opening in the first dielectric layer and the second dielectric layer, forming a photoresist in and over the via opening;
   patterning the photoresist with a pattern for the trench opening; and
   etching the trench opening in the second dielectric layer using the photoresist as an etching mask.

6. The method of claim 1, wherein the patterning the via opening in the first dielectric layer and the second dielectric layer comprises:
   after the forming the trench opening in the second dielectric layer, forming a photoresist in and over the trench opening;
   patterning the photoresist with a pattern for the via opening; and
   etching the via opening in the first dielectric layer and the second dielectric layer using the photoresist as an etching mask.

7. The method of claim 1, wherein:
sidewalls of the via opening in the first dielectric layer form a first angle with a plane parallel to a major surface of the substrate;
sidewalls of the via opening in the second dielectric layer form a second angle with the plane parallel to the major surface of the substrate; and
the first angle is greater than the second angle.

8. The method of claim 1, wherein a first relative permittivity of the first dielectric layer is greater than a second relative permittivity of the second dielectric layer.

9. A method comprising:
forming an inter-layer dielectric (ILD) over a substrate comprising an active device;
forming a contact plug in the ILD, the contact plug being electrically connected to the active device of the substrate;
forming a first conductive line over and electrically connected to the contact plug;
depositing an etch stop layer over the first conductive line;
forming a plurality of dielectric layers over the etch stop layer;
patterning a via opening extending into at least a portion of each of the plurality of dielectric layers and exposing the etch stop layer, the via opening formed through each of the dielectric layers using first etching process parameters;
forming a trench opening in a topmost dielectric layer of the dielectric layers, a distance between a top surface of the topmost dielectric layer and a bottom of the trench opening being less than a distance between the top surface of the topmost dielectric layer and a bottom surface of the topmost dielectric layer;
removing portions of the etch stop layer to expose the first conductive line;
depositing a diffusion barrier layer over the dielectric layers, along sidewalls of the via opening, and over the first conductive line;
forming a conductive material over the diffusion barrier layer and in the via opening; and
planarizing the conductive material such that top surfaces of the conductive material, the diffusion barrier layer, and the topmost dielectric layer are level.

10. The method of claim 9, wherein the patterning the via opening comprises:
continuously etching at least a portion of each of the plurality of dielectric layers with the first etching process parameters.

11. The method of claim 10, wherein:
sidewalls of the via opening in the topmost dielectric layer form a first angle with a plane parallel to a major surface of the substrate;
sidewalls of the via opening in a bottommost dielectric layer form a second angle with the plane parallel to the major surface of the substrate; and
the second angle is greater than the first angle.

12. The method of claim 9, further comprising:
before the patterning the via opening, forming the trench opening.

13. The method of claim 9, further comprising:
after the patterning the via opening, forming the trench opening.

14. The method of claim 9, wherein the topmost dielectric layer has a lesser relative permittivity than ones of the dielectric layers underlying the topmost dielectric layer.

15. A method comprising:
forming an inter-layer dielectric (ILD) over a substrate comprising an active device;
forming a contact plug in the ILD, the contact plug being electrically connected to the active device of the substrate;
forming a first conductive line over and electrically connected to the contact plug;
depositing an etch stop layer over the first conductive line;
depositing an intermediate layer over the etch stop layer, the intermediate layer comprising a first dielectric material;
depositing an inter-metal dielectric (IMD) layer over the intermediate layer, the IMD layer comprising a second dielectric material different from the first dielectric material;
performing a first etching process to pattern a via opening in the IMD layer;
continuing the first etching process to extend the via opening through the intermediate layer;
performing a second etching process to pattern a trench opening in the IMD layer, the second etching process being different from the first etching process;
performing a third etching process to extend the via opening through the etch stop layer and expose the first conductive line, wherein after the first, second, and third etching processes, a height of the via opening is greater than a height of the intermediate layer, and a height of the trench opening is less than a height of the IMD layer; and
filling the via opening and the trench opening with a conductive material.

16. The method of claim 15, wherein after the via opening is extended through the intermediate layer:
sidewalls of the via opening in the IMD layer form a first angle with a plane parallel to a major surface of the substrate;
sidewalls of the via opening in the intermediate layer form a second angle with the plane parallel to the major surface of the substrate; and
the second angle is greater than the first angle.

17. The method of claim 15, wherein performing the second etching process comprises:
forming a photoresist over the IMD layer and in the via opening, portions of the photoresist contacting exposed sidewalls of the intermediate layer, exposed sidewalls of the IMD layer, and an exposed top surface of the etch stop layer;
patterning the photoresist with a pattern for the trench opening; and
transferring the pattern of the photoresist to the IMD layer.

18. The method of claim 15, wherein a first relative permittivity of the intermediate layer is greater than a second relative permittivity of the IMD layer.

19. The method of claim 15, wherein a first etch rate of the IMD layer is greater than a second etch rate of the intermediate layer relative the first etching process.

20. The method of claim 1, wherein a first etch rate of the first dielectric layer is less than a second etch rate of the second dielectric layer during the first etching process.

* * * * *